United States Patent
Ikeda et al.

(10) Patent No.: US 7,237,219 B2
(45) Date of Patent: Jun. 26, 2007

(54) DESIGN AID APPARATUS, DESIGN AID METHOD, AND COMPUTER-EXECUTABLE PROGRAM

(75) Inventors: Hiroshi Ikeda, Ibaraki (JP); Takeshi Nakayama, Katano-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 11/042,978

(22) Filed: Jan. 25, 2005

(65) Prior Publication Data

US 2005/0183044 A1    Aug. 18, 2005

(30) Foreign Application Priority Data

Feb. 17, 2004    (JP)    ............... 2004-040384

(51) Int. Cl.
G06F 9/45    (2006.01)
G06F 17/50    (2006.01)
H03K 17/693    (2006.01)

(52) U.S. Cl. ............................. 716/15; 716/9
(58) Field of Classification Search .......... 716/5, 716/11, 15, 9
See application file for complete search history.

(56) References Cited

U.S. PATENT DOCUMENTS 6,629,302 B2    9/2003    Miura et al.

| | | | |
|---|---|---|---|
| 2001/0047508 A1* | 11/2001 | Miura et al. | 716/8 |
| 2002/0178429 A1* | 11/2002 | Nakayama et al. | 716/15 |
| 2005/0022149 A1* | 1/2005 | Smith et al. | 716/15 |
| 2005/0138592 A1* | 6/2005 | Morgan et al. | 716/12 |

FOREIGN PATENT DOCUMENTS

| JP | 3087669 | 7/2000 |
|---|---|---|
| JP | 2001-243271 | 9/2001 |

* cited by examiner

*Primary Examiner*—Paul Dinh
*Assistant Examiner*—Suresh Memula

(57) ABSTRACT

A multilayer wiring board formed by laminating a plurality of dielectrics including a specific dielectric capable of embedding components therein is separated into first and second portions that are respectively made up of sets of dielectrics on opposite sides of the specific dielectric. A first aid unit stores design information about placement of objects to the first portion, and manages and displays the design information according to a user command to aid in design of the first portion. A second aid unit stores design information about placement of objects to the second portion, and manages and displays the design information according to a user command to aid in design of the second portion. Further, the first and second aid units each store design information about placement of boundary objects which extend to both the first and second portions, and cooperatively manage the design information and each display it.

19 Claims, 41 Drawing Sheets

FIG.5A

BOARD TABLE

| BOARD ID | SHAPE | LAYER COUNT |
|---|---|---|
| B1 | (0,0)(120,0)(120,100)(0,100) | 4 |

FIG.5B

LAYER TABLE

| LAYER ID | LAYER TYPE |
|---|---|
| L11(TOP) | SIGNAL |
| L12 | POWER |
| L13 | GROUND |
| L14(BOTTOM) | SIGNAL |

FIG.5C

DIELECTRIC TABLE

| DIELECTRIC ID | Z POSITION | DIELECTRIC CONSTANT | THICKNESS |
|---|---|---|---|
| D11 | L11-L12 | 0.1 | 10 $\mu$m |
| D12 | L12-L13 | 0.1 | 10 $\mu$m |
| D13 | L13-L14 | 0.1 | 10 $\mu$m |

FIG.5D

COMPONENT PLACEMENT TABLE

| COMPONENT ID | COMPONENT TYPE | Z POSITION | XY POSITION | HEIGHT |
|---|---|---|---|---|
| IC1 | MN700 | TOP | (70,40)-(110,80) | 400 $\mu$m |
| IC2 | MN701 | BOTTOM | (60,20)-(90,50) | 400 $\mu$m |

FIG.6A
BOUNDARY DIELECTRIC TABLE

| BOUNDARY DIELECTRIC ID | Z POSITION | DIELECTRIC CONSTANT | THICKNESS |
|---|---|---|---|
| SD1 | B1.L14—B2.L21 | 0.2 | 600 μm |

FIG.6B
BOUNDARY VIA TABLE

| VIA ID | NET ID | Z POSITION | XY POSITION | DIAMETER |
|---|---|---|---|---|
| V1 | N1 | SD1 | (20, 80) | 0.2mm |

FIG.7A
BOARD TABLE

| BOARD ID | SHAPE | LAYER COUNT |
|---|---|---|
| B2 | (0,0)(120,0)(120,100)(0,100) | 6 |

FIG.7B
LAYER TABLE

| LAYER ID | LAYER TYPE |
|---|---|
| L21(TOP) | SIGNAL |
| L22 | SIGNAL |
| L23 | POWER |
| L24 | GROUND |
| L25 | SIGNAL |
| L26(BOTTOM) | SIGNAL |

FIG.7C
DIELECTRIC TABLE

| DIELECTRIC ID | Z POSITION | DIELECTRIC CONSTANT | THICKNESS |
|---|---|---|---|
| D21 | L21-L22 | 0.1 | 10 μm |
| D22 | L22-L23 | 0.1 | 10 μm |
| D23 | L23-L24 | 0.1 | 10 μm |
| D24 | L24-L25 | 0.1 | 10 μm |
| D25 | L25-L26 | 0.1 | 10 μm |

FIG.7D
COMPONENT PLACEMENT TABLE

| COMPONENT ID | COMPONENT TYPE | Z POSITION | XY POSITION | HEIGHT |
|---|---|---|---|---|
| IC3 | MN800 | TOP | (40,60)-(70,90) | 400 μm |
| IC4 | MN801 | BOTTOM | (10,30)-(50,70) | 400 μm |

FIG.10

BOUNDARY VIA OBSTACLE INQUIRY MESSAGE

| DIRECTION | INSTRUCTION | Z POSITION | XY POSITION | DIAMETER |
|---|---|---|---|---|
| B2→B1 | BOUNDARY VIA OBSTACLE INQUIRY | SD1 | (80, 30) | 0.2mm |

FIG.11

BOUNDARY VIA PLACEMENT NOTIFICATION MESSAGE

| DIRECTION | INSTRUCTION | VIA ID | NET ID | Z POSITION | XY POSITION | DIAMETER |
|---|---|---|---|---|---|---|
| B2→B1 | BOUNDARY VIA PLACEMENT NOTIFICATION | V2 | N2 | SD1 | (80, 30) | 0.2mm |

FIG.14

COMPONENT OBSTACLE INQUIRY MESSAGE

| DIRECTION | INSTRUCTION | Z POSITION | XY POSITION | HEIGHT |
|---|---|---|---|---|
| B2→B1 | COMPONENT OBSTACLE INQUIRY | TOP | (80,30)-(100,50) | 400 μm |

FIG.15

HEIGHT RESERVATION TABLE

| Z POSITION | XY POSITION | HEIGHT |
|---|---|---|
| SD1 | (60,20)-(90,50) | 400 μm |

FIG.17

HEIGHT RESERVATION MESSAGE

| DIRECTION | INSTRUCTION | Z POSITION | XY POSITION | HEIGHT |
|---|---|---|---|---|
| B2→B1 | HEIGHT RESERVATION | SD1 | (80,30)-(100,50) | 400 μm |

FIG.20A

HOLLOW TABLE

| Z POSITION | XY POSITION |
|---|---|
| D12 | (18,18) - (52,52) |
| D13 | (18,18) - (52,52) |

FIG.20B

PROHIBITION TABLE

| Z POSITION | XY POSITION |
|---|---|
| L13 | (15,15) - (55,55) |
| L14 | (15,15) - (55,55) |
| D12 | (15,15) - (55,55) |
| D13 | (15,15) - (55,55) |

FIG.31A
PIN TABLE

| COMPONENT ID | PIN ID | XY POSITION |
|---|---|---|
| IC1 | PIN11 | (72,69)-(74,71) |
| IC1 | PIN12 | (72,72)-(74,74) |
| IC2 | PIN21 | (62,36)-(64,38) |

FIG.31B
WIRE TABLE

| WIRE ID | NET ID | Z POSITION | XY POSITION | WIDTH |
|---|---|---|---|---|
| F11 | N1 | L11 | (73,70)-(63,70) | 2 |
| F12 | N2 | L11 | (73,73)-(83,73) | 2 |

FIG.31C
NET TABLE

| NET ID | NET ATTRIBUTE | CONNEC-TION PIN | CONNEC-TION VIA | CONNEC-TION WIRE | CONNEC-TION ATTRIBUTE |
|---|---|---|---|---|---|
| N1 | SIGNAL | IC1.PIN11 | V1 | F11 | GLOBAL |
| N2 | SIGNAL | IC1.PIN12<br>IC2.PIN21 | — | F12 | LOCAL |

FIG. 37A TOTAL BOARD TABLE

| BOARD ID | SHAPE | LAYER COUNT |
|---|---|---|
| B0 | (0,0)(120,0)(120,100)(0,100) | 10 |

FIG. 37B TOTAL LAYER TABLE

| LAYER ID | LAYER TYPE |
|---|---|
| L11 | SIGNAL |
| L12 | POWER |
| L13 | GROUND |
| L14 | SIGNAL |
| L21 | SIGNAL |
| L22 | SIGNAL |
| L23 | POWER |
| L24 | GROUND |
| L25 | SIGNAL |
| L26 | SIGNAL |

FIG. 37C TOTAL DIELECTRIC TABLE

| DIELECTRIC ID | Z POSITION | DIELECTRIC CONSTANT | THICKNESS | DIVISION |
|---|---|---|---|---|
| D11 | L11-L12 | 0.1 | 10 μm | NOT POSSIBLE |
| D12 | L12-L13 | 0.1 | 10 μm | NOT POSSIBLE |
| D13 | L13-L14 | 0.1 | 10 μm | NOT POSSIBLE |
| SD1 | L14-L21 | 0.2 | 600 μm | POSSIBLE |
| D21 | L21-L22 | 0.1 | 10 μm | NOT POSSIBLE |
| D22 | L22-L23 | 0.1 | 10 μm | NOT POSSIBLE |
| D23 | L23-L24 | 0.1 | 10 μm | NOT POSSIBLE |
| D24 | L24-L25 | 0.1 | 10 μm | NOT POSSIBLE |
| D25 | L25-L26 | 0.1 | 10 μm | NOT POSSIBLE |

FIG. 37D TOTAL COMPONENT PLACEMENT TABLE

| COMPONENT ID | COMPONENT TYPE | Z POSITION | PLACEMENT DIRECTION | XY POSITION | HEIGHT |
|---|---|---|---|---|---|
| IC1 | MN700 | L11 | A | (70,40)-(110,80) | 400 μm |
| IC2 | MN701 | L14 | B | (60,20)-(90,50) | 400 μm |
| IC3 | MN800 | L21 | A | (40,60)-(70,90) | 400 μm |
| IC4 | MN801 | L26 | B | (10,30)-(50,70) | 400 μm |

FIG. 37E TOTAL VIA TABLE

| VIA ID | NET ID | Z POSITION | XY POSITION | DIAMETER |
|---|---|---|---|---|
| V1 | N1 | SD1 | (20,80) | 0.2mm |

DESIGN AID APPARATUS, DESIGN AID METHOD, AND COMPUTER-EXECUTABLE PROGRAM

This application is based on an application No. 2004-040384 filed in Japan, the contents of which are hereby incorporated by reference.

BACKGROUND OF THE INVENTION

1. Field of the Invention

The present invention relates to a design aid apparatus for aiding in design of placement of objects for a multilayer wiring board. The present invention in particular relates to techniques of aiding in separately designing different board portions which are set in a lamination direction of the multilayer wiring board.

2. Related Art

Conventionally, electronic devices which need to be made smaller in size are often implemented using multilayer wiring boards.

An advanced manufacturing technique in recent years makes it possible to produce multilayer wiring boards in which tiny components such as bare chip semiconductors are embedded (for example, see the news release article dated Sep. 9, 2002 by Matsushita Electric Industrial Co., Ltd. "Development of New 3-D Module "SIMPACT™"" (http://panasonic.co.jp/corp/news/official.data/data .dir/jn020909-1/jn020909-1.html). Such a manufacturing technique achieves a high degree of flexibility in placement of components to a multilayer wiring board, and significantly improves the packaging density, of the multilayer wiring board.

FIG. 40 shows a multilayer wiring board 2001 having components embedded therein, as one example. This multilayer wiring board 2001 has components 2201 and 2206 mounted on the board surfaces, and components 2202 to 2205 embedded inside.

A design aid apparatus capable of assisting in design of placement of components inside a multilayer wiring board is well known in the art (e.g. Japanese Patent Application Publication No. 2001-243271). By optimally placing components inside and on the board surfaces of a multilayer wiring board using such a design aid apparatus, the packaging density can be significantly increased, with it being possible to realize a smaller electronic device.

This method, however, has the following problem. When the multilayer wiring board has a greater number of layers, the degree of flexibility in placement of components increases. If the flexibility is excessively high, an enormous amount of time and effort is needed for a design operation even with the help of the above design aid apparatus.

In view of this, the following method has been proposed to design a multi layer wiring board. According to this method, the multilayer wiring board is separated into board portions in a lamination direction, and design of placement of components is performed separately for each board portion.

FIG. 41 shows a multilayer wiring board 3001 which is separated. by a boundary dielectric 3001 into board portions 3002 and 3003. This multilayer wiring board 3001 has components 3201 and 3205 mounted on the board surfaces, and components 3202 to 3204 embedded inside.

According to the above design method, the total design of the multilayer wiring board 3001 can be conducted through a partial design process and a boundary management process. In the partial design process, the board portions 3002 and 3003 are designed separately. In the boundary management process, the design of the board portion 3002 and the design of the board portion 3003 made in the partial design process are managed to be consistent with each other in relation to the boundary dielectric 3301.

Though not able to achieve an optimum packaging density, this design method treats fewer layers in each partial design process, thereby limiting the flexibility in placement of components. Also, the partial design process for the board portion 3002 and the partial design process for the board portion 3003 can be conducted in the form of division of labor, with it being possible to reduce the number of design steps and shorten the design time.

Here, embedment of components in each of the board portions 3002 and 3003 may be prohibited. In such a case, components are placed only on the surfaces of each of the board portions 3002 and 3003 in the partial design process. This further reduces the number of design steps.

Conventionally, the above design method is used in consideration of a desired packaging density and design time. Note here that a multilayer wiring board having board portions which are each prohibited from embedment of components can be produced using the aforementioned advanced manufacturing technique. Hence such a multilayer wiring board is equivalent to a multilayer wiring board in which components are not embedded in some of a plurality of dielectrics.

In the absence of a design aid apparatus for totally and effectively aiding in design of a multilayer wiring board according to the above design method, however, the following problem arises.

Suppose embedment of components in each board portion of a multilayer wiring board is prohibited. In this case, by using a design aid apparatus for aiding in design of placement of components only on board surfaces, each partial design process can be favorably performed in the form of division of labor. However, the boundary management process needs to be performed manually. In view of a significant increase in size of circuitry which is subjected to design in recent years, this method is no longer practical.

Alternatively, the whole multilayer wiring board may be designed as one unit, using the aforementioned design aid apparatus for aiding in design of placement of components inside a multilayer wiring board. According to this method, however, it is difficult to perform each partial design process in the form of division of labor, so that the effect of shortening the design time lessens. Further, the user is required to master the operation of such a design aid apparatus.

SUMMARY OF THE INVENTION

In view of the above problems, the present invention aims to provide a design aid apparatus for totally and effectively aiding in design of a multilayer wiring board. The stated aim can be achieved by a design aid apparatus for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, including: a first aid unit operable to manage and display design information about placement of a first object to the first portion, according to a user instruction; and a second aid unit operable to, independently of the first aid unit, manage and display design information about placement of a second object to the second portion, according to a user instruction, wherein the first aid unit and the second aid unit cooperatively manage boundary design information about placement of a boundary object that extends to both the first portion and the second portion, and each display the boundary design information.

Here, the first object may be a component that has an electrical connection point at the first portion and is embedded in the specific dielectric, wherein the second object is a component that has an electrical connection point at the second portion and is embedded in the specific dielectric, and the boundary object is a via that has electrical connection points at both the first portion and the second portion, and is formed in the specific dielectric.

Here, the first aid unit and the second aid unit maybe realized by a single computer, or by two independent computers connected in a communicative state.

Here, each of the first aid unit and the second aid unit may hold the boundary design information, and include: a send unit operable to send, if the held boundary design information is changed, notification information indicating the change to the other aid unit; and a data synchronization unit operable to modify the held boundary design information to be identical to the boundary design information changed in the other aid unit, based on notification information sent from the other aid unit.

According to these constructions, when a design operation of placement of objects for the multilayer wiring board is conducted in the form of division of labor with support of the first and second aid units, the boundary design information relating to both the first and second portions is managed and displayed by both the first and second aid units. This enables each aid unit to easily check the changes made to the boundary design information by the other aid unit.

For example, the boundary design information shows the placement of a via that connects to both the first and second portions. When one aid unit updates the boundary design information in accordance with an addition or movement of such a via, the other aid unit displays the added or moved via based on the updated boundary design information.

Through such a display, the user can examine the design consistency in the boundary of the first and second portions, with regard to whether placement of an object is obstructed by the via added by the other aid unit or whether necessary connection is maintained after the via has been moved by the other aid unit.

Thus, the design aid apparatus helps the user check the design consistency with less time and effort than in the case of manual check. In this way, the design aid apparatus totally and effectively aids in design of the multilayer wiring board.

Here, the second portion may be incapable of having components embedded therein or be prohibited to have components embedded therein, wherein the second aid unit accepts a user instruction to place a component to the second portion, only if the component is to be placed on an end of the second portion in a lamination direction so as to be located outside the second portion.

According to this construction, the second portion is treated as a multilayer wiring board for which components can be placed only on board surfaces. This simplifies the design of placement of components with respect to the second portion. Due to limited flexibility in placement of components, the packaging density decreases to some extent, but the number of design steps can be reduced.

Here, the second aid unit may judge, in cooperation with the first aid unit, whether the first object is an obstacle to at least one of the placement of the second object and the placement of the boundary object.

Here, the second aid unit may include: a send unit operable to send at least one of inquiry information corresponding to the placement of the second object and inquiry information corresponding to the placement of the boundary object, to the first aid unit, wherein the first aid unit includes: an intersection judgment unit operable to judge, based on the inquiry information sent from the second aid unit, whether a placement area of the first object intersects with at least one of a placement area of the second object and a placement area of the boundary object; and a reply unit operable to send a result of the judgment by the intersection judgment unit, to the second aid unit, and the second aid unit judges that the first object is the obstacle,if the result of the judgment sent from the first aid unit is affirmative.

According to these constructions, the first and second aid units cooperatively judge whether the object managed by the first aid unit is an obstacle to the placement of the object managed by the second aid unit. This allows the user to easily examine if objects do not interfere with each other in the boundary of the first and second portions.

This judgment operation may be performed each time an object placement command is received. In so doing, the boundary of the first and second portions can be constantly kept from interference between objects.

Alternatively, the judgment operation may be collectively performed after a plurality of object placement commands are received. In such a case, the interference between objects can be eliminated after quick completion of command inputs. Thus, the design aid apparatus can be used in various manners, which contributes to greater convenience.

Here, the first aid unit may include: a send unit operable to send notification information corresponding to the placement of the first object to the second aid unit, wherein the second aid unit includes: a storage unit operable to store the notification information, and the second aid unit judges, based on the notification information stored in the storage unit, whether a placement area of the first object intersects with at least one of a placement area of the second object and a placement area of the boundary object, and if a result of the judgment is affirmative, judges that the first object is the obstacle.

According to this construction, the second aid unit judges whether the object managed by the first aid unit is an obstacle to the placement of the object managed by the second aid unit, based on the notification information received from the first aid unit beforehand. This makes it unnecessary for the second aid unit to communicate with the first aid unit at the time of the judgment operation, thereby speeding up the response in the judgment operation.

Here, if the first object is judged as the obstacle, the second aid unit may generate at least one of design information about alternative placement of the second object and boundary design information about alternative placement of the boundary object so that the first object is no longer the obstacle.

Here, the second aid unit may include: a send unit operable to send, if the first object is judged as the obstacle, at least one of notification information corresponding to the placement of the second object and notification information corresponding to the placement of the boundary object, to the first aid unit, wherein the first aid unit generates, based on the notification information sent from the second aid unit, design information about alternative placement of the first object so that the first object is no longer the obstacle.

According to these constructions, if the object managed by the second aid unit interferes with the object managed by the first aid unit, the first and second aid units cooperatively attempt to avoid the interference. This significantly reduces the burden on the user to overcome the interference between objects in the boundary of the first and second portions.

Here, the second aid unit may include: a send unit operable to send notification information corresponding to the placement of the second object to the first aid unit, wherein the first aid unit includes: a prohibition information generation unit operable to generate, based on the notification information, prohibition information showing a prohibition area where placement of objects is prohibited, the prohibition area including an area of the first portion that intersects with a placement area of the second object.

Here, the second aid unit may include: a send unit operable to send notification information corresponding to the placement of the second object to the first aid unit, wherein the first aid unit includes: a hollow information generation unit operable to generate, based on the notification information, hollow information showing a hollow area which is devoid of a dielectric substance, the hollow area including an area of the first portion that intersects with a placement area of the second object.

According to these constructions, in the case where such a component that penetrates through the specific dielectric and enters into the first portion is permitted to be placed on the second portion, the first aid unit appropriately manages the area in the first portion where objects cannot be placed due to the presence of the component.

Here, the design aid apparatus may further include: a dielectric thickness calculation unit operable to calculate a thickness of at least one of the plurality of dielectrics, in accordance with placement of a component embedded in the dielectric.

According to this construction, the thickness of the dielectric is calculated in accordance with the placement of components within the dielectric. This significantly reduces the burden on the user to set an appropriate thickness of the dielectric. Also, by determining the placement of components and then calculating a minimum thickness required of the dielectric to contain these components according to the determined placement, the thickness of the whole multilayer wiring board can be reduced.

Here, the design aid apparatus may further include: a direction setting unit operable to set a direction of a wire from an electrical connection pin that is provided on a periphery of an outer surface of a component which is placed to the first portion or the second portion, depending on whether the electrical connection pin is connected to an object placed to the same portion as the component; and a wire information generation unit operable to generate wire information showing an area that has a predetermined width and extends from the electrical connection pin in the set direction by a predetermined length, as a placement area of the wire.

According to this construction, a wire from a component pin that is connected to an object belonging to the same portion as the component is directed to inside the component, since the routing flexibility is relatively high in this case. Meanwhile, a wire from a component pin that is connected to an object belonging to the different portion from the component is directed to a wide area outside the component, since the routing flexibility is relatively low in this case. Thus, the routing flexibility in the latter case can be enhanced. This prevents a failure of routing the wire from the component pin in the latter case, and thereby prevents a failure of complete connection of all wires.

The present invention can also be realized by a design information conversion apparatus for converting design information about a multilayer wiring board that is formed by laminating a plurality of dielectrics including a specific dielectric capable of having components embedded therein, including: a judgment unit operable to judge, for each of the plurality of dielectrics, whether the dielectric is the specific dielectric; and a separation unit operable to separate, from total design information about the whole multilayer wiring board, (a) partial design information about placement of a first object to a first portion which is made up of a set of dielectrics on one side of the specific dielectric judged by the judgment unit, (b) partial design information about placement of a second object to a second portion which is made up of a set of dielectrics on an opposite side of the specific dielectric, and (c) boundary design information about placement of a boundary object which extends to both the first portion and the second portion.

According to this construction, the total design information can be converted to the partial design information and the boundary design information. The partial design information and the boundary design information are suitable for use in the design process, whereas the total design information is suitable for use in the manufacturing process. With the provision of the design information conversion apparatus, each of these processes can be carried out using the favorable type of design information.

The present invention can also be realized by a design aid method for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, the aiding being performed using a first aid unit corresponding to the first portion and a second aid unit corresponding to the second portion, the design aid method including: a first aid step of the first aid unit managing and displaying design information about placement of a first object to the first portion, according to a user instruction; a second aid step of the second aid unit, independently of the first aid unit, managing and displaying design information about placement of a second object to the second portion, according to a user instruction; and a boundary cooperation step of the first aid unit and the second aid unit cooperatively managing boundary design information about placement of a boundary object that extends to both the first portion and the second portion, and each displaying the boundary design information.

According to this method, the same effects as the above design aid apparatus can be achieved.

The present invention can also be realized by a design information conversion method for converting design information about a multilayer wiring board that is formed by laminating a plurality of dielectrics including a specific dielectric capable of having components embedded therein, including: an acquisition step of acquiring total design information about the whole multilayer wiring board; a judgment step of judging, for each of the plurality of dielectrics, whether the dielectric is the specific dielectric, based on the total design information; and a separation step of separating, from the total design information, (a) partial design information about placement of a first object to a first portion which is made up of a set of dielectrics on one side of the specific dielectric judged in the judgment step, (b) partial design information about placement of a second object to a second portion which is made up of a set of dielectrics on an opposite side of the specific dielectric, and (c) boundary design information about placement of a boundary object which has electrical connection points at both the first portion and the second portion.

According to this method, the same effects as the above design information conversion apparatus can be achieved.

The present invention can also be realized by a computer-executable program for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, the aiding being performed using a first aid unit corresponding to the first portion and a second aid unit corresponding to the second portion, the program including code for causing a computer that realizes the first aid unit and a computer that realizes the second aid unit to perform: a first aid step of the first aid unit managing and displaying design information about placement of a first object to the first portion, according to a user instruction; a second aid step of the second aid unit, independently of the first aid unit, managing and displaying design information about placement of a second object to the second portion, according to a user instruction; and a boundary cooperation step of the first aid unit and the second aid unit cooperatively managing boundary design information about placement of a boundary object that extends to both the first portion and the second portion, and each displaying the boundary design information.

The present invention can also be realized by a computer-executable program for converting design information about a multilayer wiring board that is formed by laminating a plurality of dielectrics including a specific dielectric capable of having components embedded therein, the program including code for causing a computer to perform: an acquisition step of acquiring total design information about the whole multilayer wiring board; a judgment step of judging, for each of the plurality of dielectrics, whether the dielectric is the specific dielectric, based on the total design information; and a separation step of separating, from the total design information, (a) partial design information about placement of a first object to a first portion which is made up of a set of dielectrics on one side of the specific dielectric judged in the judgment step, (b) partial design information about placement of a second object to a second portion which is made up of a set of dielectrics on an opposite side of the specific dielectric, and (c) boundary design information about placement of a boundary object which has electrical connection points at both the first portion and the second portion.

By executing these programs on a computer, the design aid method and the design information conversion method having the same effects as above can be realized.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIGS. 5A to 5D respectively show example contents of a board table, a layer table, a dielectric table, and a component placement table held in the first aid unit;

FIGS. 6A and 6B respectively show example contents of a boundary dielectric table and a boundary via table held in both the first aid unit and the second aid unit;

FIGS. 7A to 7D respectively show example contents of a board table, a layer table, a dielectric table, and a component placement table held in the second aid unit;

FIG. 10 shows an example of a boundary via obstacle inquiry message;

FIG. 11 shows an example of a boundary via placement notification message;

FIG. 14 shows an example of a component obstacle inquiry message;

FIG. 15 shows example contents of a height reservation table;

FIG. 17 shows an example of a height reservation message;

FIGS. 20A and 20B respectively show example contents of a hollow table and a prohibition table held in the first aid unit;

FIGS. 31A to 31C respectively show example contents of a pin table, a wire table, and a net table;

FIGS. 37A to 37E respectively show example contents of a total board table, a total layer table, a total dielectric table, a total component placement table, and a total via table;

DESCRIPTION OF THE PREFERRED EMBODIMENTS

First Embodiment

A design aid apparatus to which a first embodiment of the present invention relates aids in design of placement of objects to a multilayer wiring board which is formed by laminating a plurality of dielectrics, separately for each board portion made up of a set of dielectrics.

The plurality of dielectrics include at least one specific dielectric in which components can be embedded. This being so, the design aid apparatus has a first aid unit corresponding to a first board portion which is made up of a set of dielectrics adjacent to one side of the specific dielectric, and a second aid unit corresponding to a second board portion which is made up of a set of dielectrics adjacent to the other side of the specific dielectric.

Design of each board portion is conducted on the assumption that the board portion itself is one multilayer wiring board. In view of this, the first and second board portions are hereafter also referred to as partial boards which are treated as multilayer wiring boards. The specific dielectric is located at the boundary between these partial boards, and therefore also referred to as a boundary dielectric.

The first aid unit aids in design of the first partial board, by managing partial design information relating to the first partial board and displaying it in accordance with a user command. Likewise, the second aid unit aids in design of the second partial board, by managing partial design information relating to the second partial board and displaying it in accordance with a user command.

Also, the first aid unit and the second aid unit cooperatively manage boundary design information relating to both the first partial board and the second partial board, and each display the boundary design information.

Partial design information includes information about placement of an object which has an electrical connection point at a corresponding partial board (e.g. a component, a via, a wire, or a plane placed to the corresponding partial board). Boundary design information includes information about placement of a boundary object which has an electrical connection point at both partial boards (e.g. a via placed between both partial boards).

When placing an object, each of the first aid unit and the second aid unit judges whether an object managed by the other aid unit is an obstacle, in cooperation with the other aid unit. The aid unit notifies the user of a result of the judgment. If the judgment is affirmative, the aid unit may also aid in avoidance of the obstacle.

The following describes the design aid apparatus of the first embodiment in more detail, with reference to drawings.

(Overall Construction)

Figure 1:
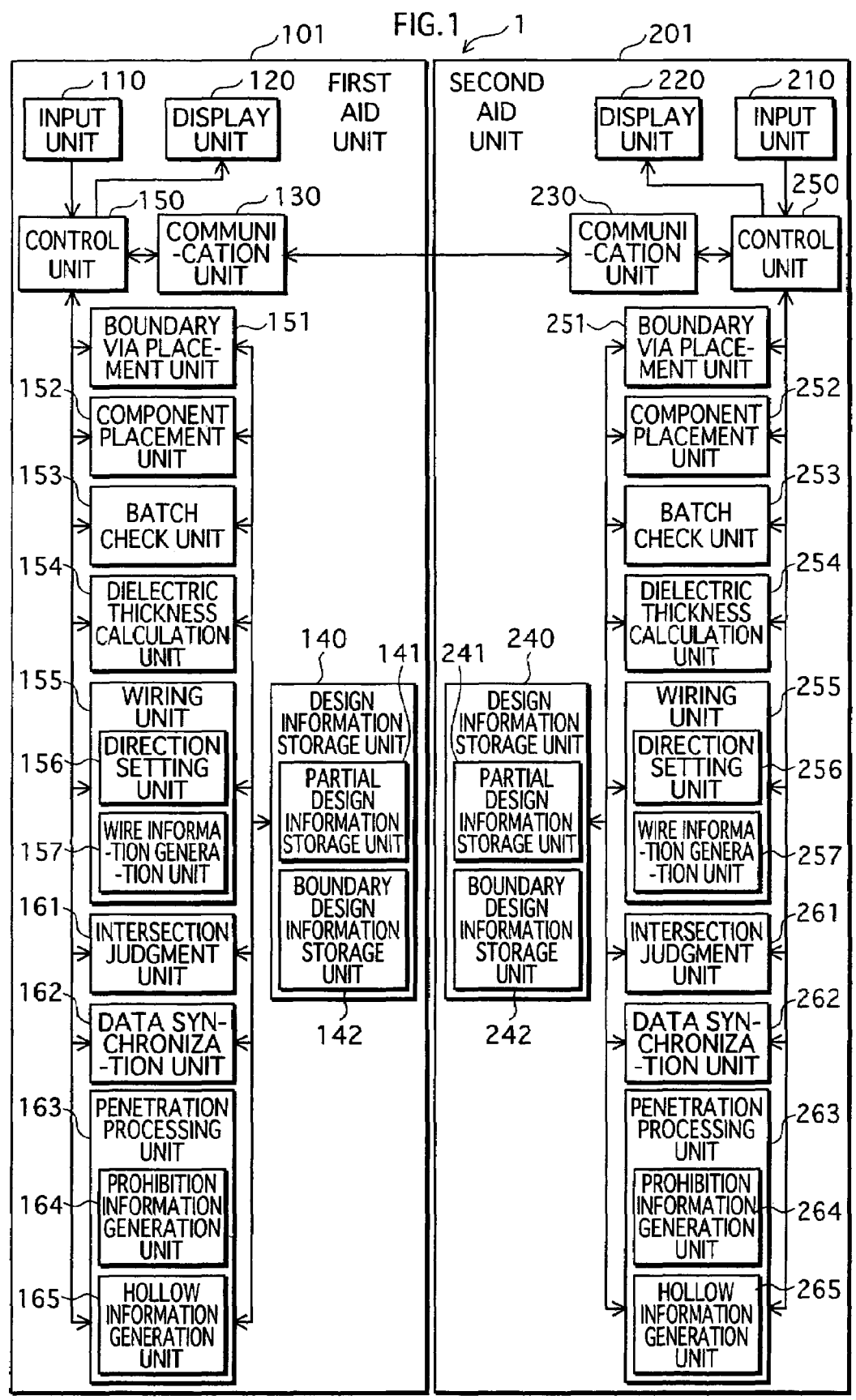
FIG. 1 is a functional block diagram showing a construction of a design aid apparatus to which a first embodiment of the present invention relates.

FIG. 1 is a functional block diagram showing an overall construction of a design aid apparatus 1 to which the first embodiment relates. The design aid apparatus 1 is roughly made up of a first aid unit 101 and a second aid unit 201 which are connected in a communicative state. The first aid unit 101 and the second aid unit 201 respectively manage the partial design information relating to the first partial board and the partial design information relating to the second partial board. Also, the first aid unit 101 and the second aid unit 201 commonly manage the boundary design information relating to both the first partial board and the second partial board. Based on these information, each of the first aid unit 101 and the second aid unit 201 assists in design of placement of objects to the corresponding partial board.

The first aid unit 101 and the second aid unit 201 may operate on a single computer system. Alternatively, the first aid unit 101 and the second aid unit 201 may operate separately on independent computer systems connected via a communication line.

Figure 2:
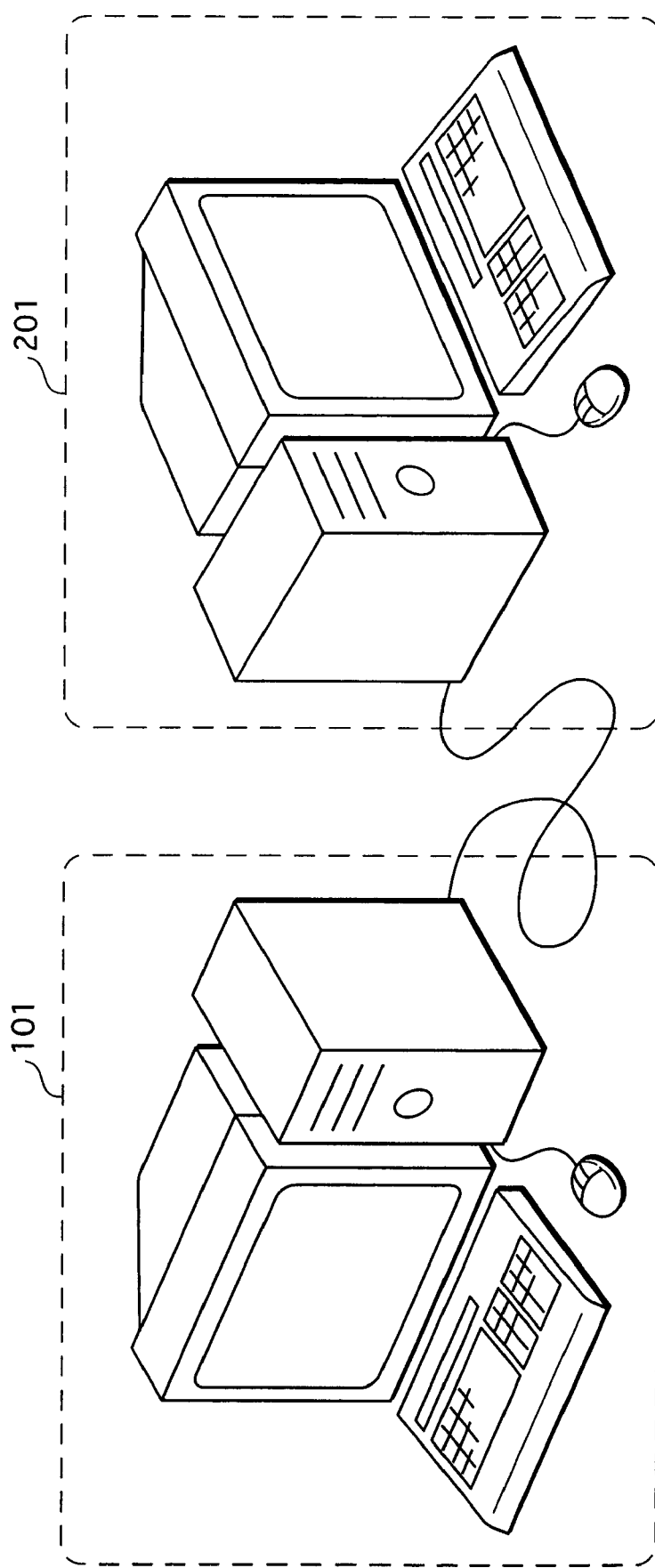
FIG. 2 shows an appearance of the design aid apparatus shown in FIG. 1.

FIG. 2 shows an appearance of the design aid apparatus 1 in the case where the first aid unit 101 and the second aid unit 201 operate separately on independent computer systems.

The first aid unit 101 and the second aid unit 201 have the same construction, and provide design aid functions symmetrically to each other. Which is to say, design aid functions that are activated by one aid unit can equally be activated by the other aid unit.

(Detailed Construction of the First Aid Unit 101)

A detailed construction of the first aid unit 101 is explained below.

An input unit 110 can be realized by an input device such as a keyboard, a mouse, a trackball, or a light pen. The input unit 110 receives various commands directed to the first aid unit 101 from the user, and outputs command information showing a received command to a control unit 150. Commands for executing design aid functions characteristic of the present invention include a boundary via placement command, a component placement command, a batch check command, a dielectric thickness calculation command, and a wiring command. Operations corresponding to these commands are explained later in detail.

A display unit 120 can be realized by a display device such as an LCD (liquid crystal display) panel, a plasma display panel, or a CRT (cathode ray tube). The display unit 120 displays a view such as a top view and a front view of a placement state of an object, in accordance with an instruction from the control unit 150.

A communication unit 130 can be realized by a communication device such as a network adapter. The communication unit 130 exchanges messages with a communication unit 230 in the second aid unit 201 connected via a communication line.

A design information storage unit 140 can be realized by a storage device such as a hard disk device or a RAM disk device. The design information storage unit 140 includes a partial design information storage unit 141 and a boundary design information storage unit 142. The partial design information storage unit 141 stores design information relating to the first partial board corresponding to the first aid unit 101. The boundary design information storage unit 142 stores design information relating to both the first partial board corresponding to the first aid unit 101 and the second partial board corresponding to the second aid unit 201.

The control unit 150, a boundary via placement unit 151, a component placement unit 152, a batch check unit 153, a dielectric thickness calculation unit 154, a wiring unit 155, an intersection judgment unit 161, a data synchronization unit 162, and a penetration processing unit 163 can be realized by a CPU, a ROM, a RAM, and the like. Functions of each of these construction elements can be achieved by the CPU executing a program stored on the ROM.

The control unit 150 controls the entire first aid unit 101. Also, the control unit 150 activates the boundary via placement unit 151, the component placement unit 152, the batch check unit 153, the dielectric thickness calculation unit 154, and the wiring unit 155, respectively in accordance with a boundary via placement command, a component placement command, a batch check command, a dielectric thickness calculation command, and a wiring command.

The boundary via placement unit 151, the component placement unit 152, the batch check unit 153, the dielectric thickness calculation unit 154, and the wiring unit 155 execute operations corresponding to the respective commands.

Here, each of the boundary via placement unit 151, the component placement unit 152, and the batch check unit 153 operates in cooperation with an intersection judgment unit 261, a data synchronization unit 262, and a penetration processing unit 263 in the second aid unit 201. To do so, each of the boundary via placement unit 151, the component placement unit 152, and the batch check unit 153 sends a message to a control unit 250 in the second aid unit 201 via the control unit 150, the communication unit 130, and the communication unit 230. According to the received message, the control unit 250 activates the intersection judgment unit 261, the data synchronization unit 262, and the penetration processing unit 263.

The second aid unit 201 has the same construction as the first aid unit 101 and so its explanation has been omitted.

(Overall Shape of a Multilayer Wiring Board)

An overall shape of a multilayer wiring board handled by the design aid apparatus 1 is explained below, using one example.

Figure 3A:
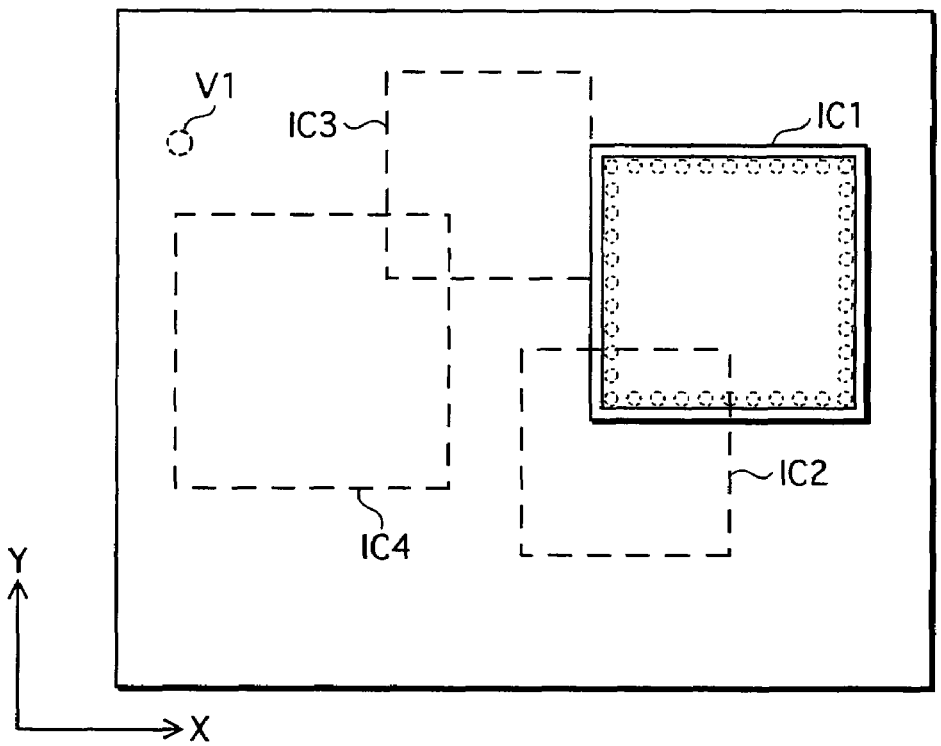
FIGS. 3A and 3B are respectively a top view and a front view showing an example of placement of components and a boundary via.
Figure 3B:
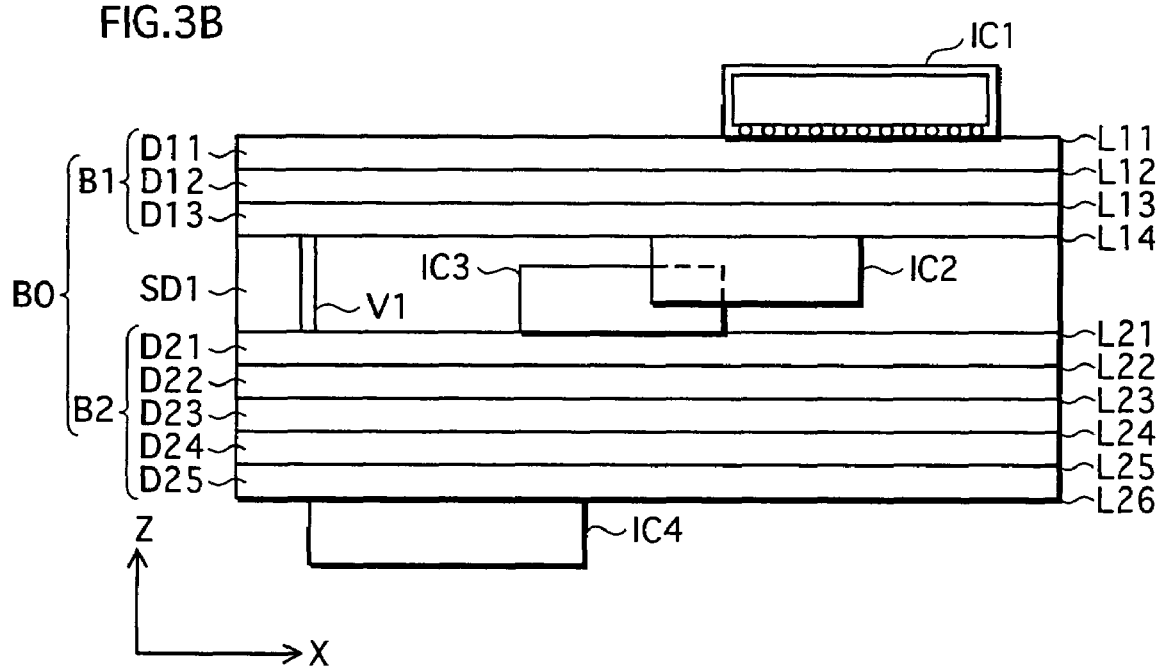

FIG. 3A is a top view of multilayer wiring board B0 as viewed in a lamination direction, whereas FIG. 3B is a front view of multilayer wiring board B0 as viewed in a direction orthogonal to the lamination direction. For the sake of convenience, a position on a board surface of multilayer wiring board B0 is expressed by XY coordinates, and a position in the lamination direction is expressed by a Z coordinate. Also, FIG. 3B is illustrated on an unequal scale in the Z direction, to facilitate understanding.

Multilayer wiring board B0 is formed by laminating dielectrics D11 to D13, SD1, and D21 to D25. Dielectric SD1 is a boundary dielectric. Dielectrics D11 to D13 form partial board B1, and dielectrics D21 to D25 form partial board B2.

End surfaces and contact surfaces of the dielectrics in the lamination direction are managed as layers L11 to L14 and L21 to L26. Here, the term "layer" is used to express a placement position of an object such as a component, a via, a wire, or a plane in the Z direction (in the case of a component and a via, a position where an electrical connection point is provided). In other words, a layer has no material substance.

Embedment of a component in dielectrics D11 to D13 constituting partial board B1 and in dielectrics D21 to D25 constituting partial board B2 is prohibited. Accordingly, a component is placed either on a board surface of multilayer wiring board B0, i.e. layer L11 or L26, so as to be positioned outside multilayer wiring board B0 (such as components IC1 and IC4), or on layer L14 or L21 so as to be positioned in boundary dielectric SD1 (such as components IC2 and IC3).

A placement area of a component is set to be larger than a nominal size of the component, in consideration of deviations in component size and positioning. FIGS. 3A and 3B show both a shape and a placement area of component IC1, and only a placement area of each of the other components.

A via can be formed in any dielectric, to electrically connect layers on both sides of the dielectric. As one example, a via is formed by charging a conductive paste into a through hole drilled in a dielectric in the lamination direction. FIGS. 3A and 3B show via V1 formed in boundary dielectric SD1. Such a via that is formed in a boundary dielectric is hereafter called a boundary via, to distinguish it from a via formed in a non-boundary dielectric.

The first aid unit 101 and the second aid unit 201 respectively aid in design of partial boards B1 and B2. Partial boards B1 and B2 can each be designed as a basic-type multilayer wiring board capable of holding components only on board surfaces.

(Screen Display)

Figure 4A:
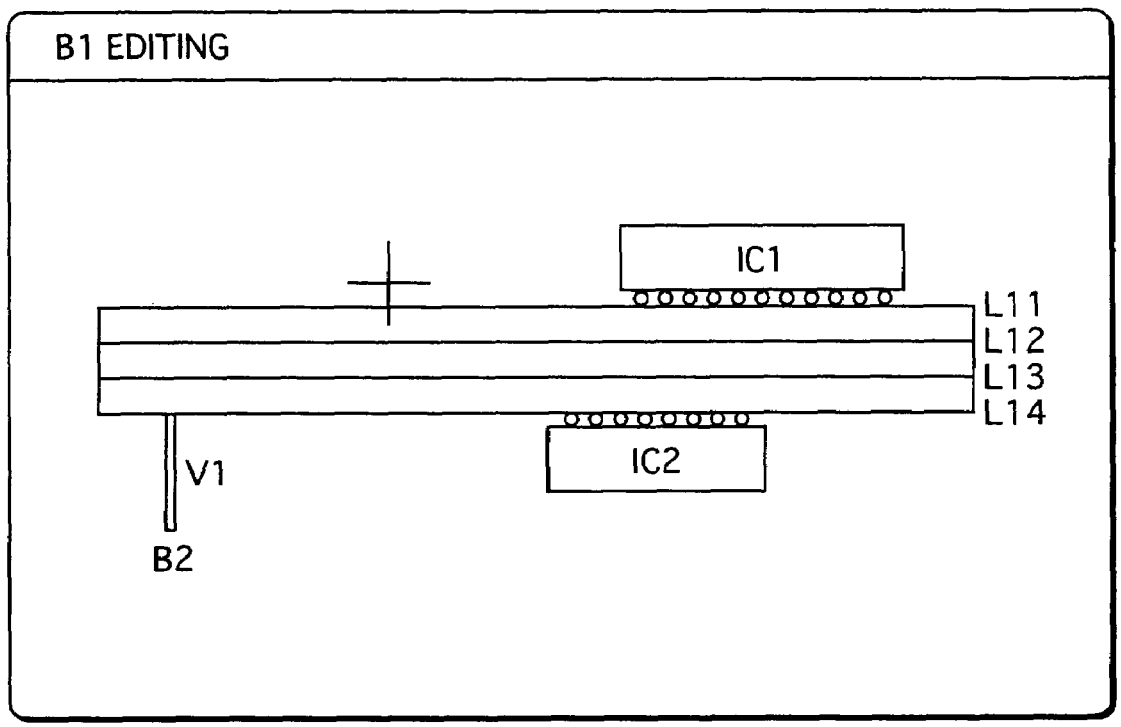
FIGS. 4A and 4B show example screens displayed respectively by a first aid unit and a second aid unit shown in FIG. 1.

FIG. 4A shows an example screen displayed by the display unit 120 in the first aid unit 101. A front view of partial board B1 to which objects are placed is shown on this screen. The display includes boundary via V1 which connects partial boards B1 and B2, but does not include the design contents specific to partial board B2.

The user performs design of placement of objects to partial board B1, by giving various commands to the first aid unit 101 through this screen. When doing so, the user has no concern with the design contents specific to partial board B2. Note that a cross-shaped symbol on the screen represents a cursor which is moved according to an operation performed by the user on the input unit 110.

Figure 4B:
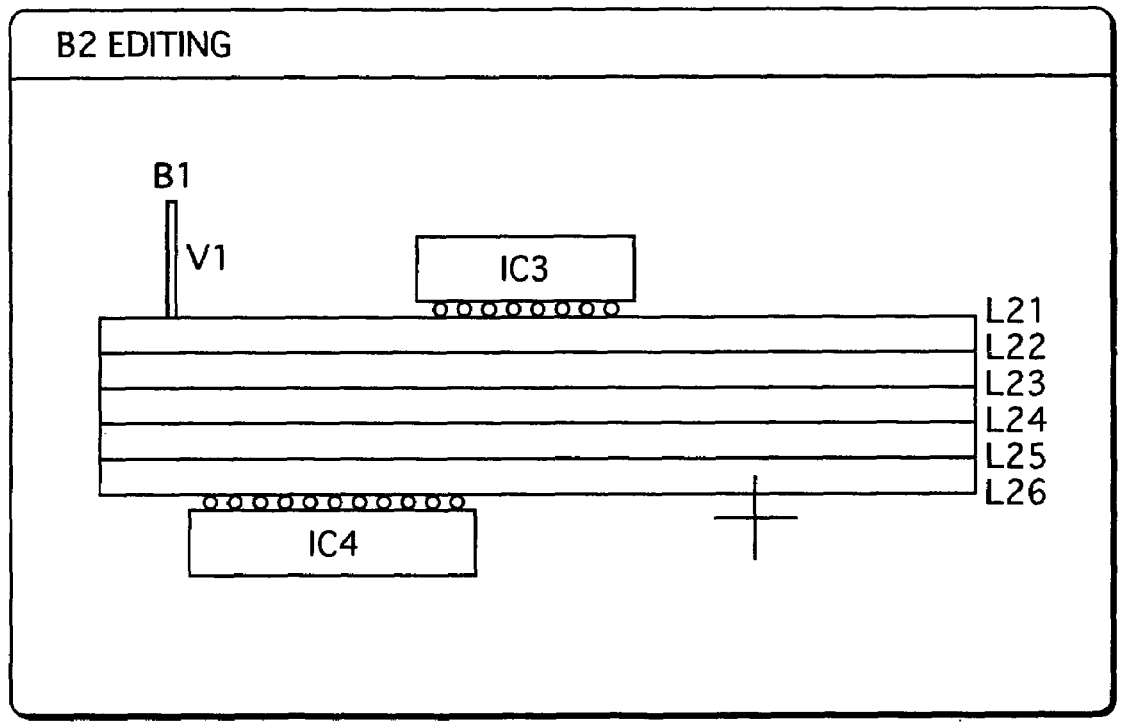

FIG. 4B shows an example screen displayed by a display unit 220 in the second aid unit 201. A front view of partial board B2 to which objects are placed is shown on this screen. The display includes boundary via V1 which connects partial boards B1 and B2, but does not include the design contents specific to partial board B1.

The user performs design of placement of objects to partial board B2, by giving various commands to the second aid unit 201 through this screen. When doing so, the user has no concern with the design contents specific to partial board B1. Note that a cross-shaped symbol on the screen represents a cursor which is moved according to an operation performed by the user on an input unit 210.

(Data Structure)

In the first aid unit 101, the partial design information storage unit 141 stores partial design information about partial board B1, and the boundary design information storage unit 142 stores boundary design information about both partial boards B1 and B2.

The partial design information is explained below.

The partial design information includes board information, layer information, dielectric information, and component placement information that relate to partial board B1. These information is stored respectively in a board table, a layer table, a dielectric table, and a component placement table provided in the partial design information storage unit 141.

FIG. 5A shows example contents of the board table. The board table has a board ID field, a shape field, and a layer count field.

The board ID field shows a board ID of partial board B1. The shape field shows X and Y coordinates of each vertex defining the outline of partial board B1. The layer count field shows the number of layers in partial board B1.

FIG. 5B shows example contents of the layer table. The layer table has a layer ID field and a layer type field.

The layer ID field shows a layer ID of a layer. The layer type field shows an application of the layer.

FIG. 5C shows example contents of the dielectric table. The dielectric table has a dielectric ID filed, a Z position field, a dielectric constant field, and a thickness field.

The dielectric ID field shows a dielectric ID of a dielectric. The Z position field shows layer IDs of layers on both sides of the dielectric. The dielectric constant field shows a dielectric constant of the dielectric. The thickness field shows a size of the dielectric in the Z direction (hereafter simply referred to as a thickness).

FIG. 5D shows example contents of the component placement table. The component placement table has a component ID field, a component type field, a Z position field, an XY position field, and a height field.

The component ID field shows a component ID of a component. The component type field shows a type of the component. The Z position field shows whether the component is placed on the top or bottom layer of partial board B1. The XY position field shows XY coordinates of opposite angles of an XY cross-section of a placement area of the component. The height field shows a size of the placement area of the component in the Z direction (hereafter simply referred to as a height).

As can be understood from the component placement table in which the Z position of the component is expressed by one of the top and bottom layers of partial board B1, embedment of components in dielectrics D11 to D13 which form partial board B1 is prohibited. Such design information corresponds to a basic-type multilayer wiring board.

The boundary design information is explained next.

The boundary design information includes boundary dielectric information and boundary via information. These information is respectively stored in a boundary dielectric table and a boundary via table provided in the boundary design information storage unit 142.

FIG. 6A shows example contents of the boundary dielectric table. The boundary dielectric table has a boundary dielectric ID field, a Z position field, a dielectric constant field, and a thickness field.

The boundary dielectric ID field shows a dielectric ID of a boundary dielectric. The Z position field shows layer IDs of layers on both sides of the boundary dielectric. The dielectric constant field shows a dielectric constant of the boundary dielectric. The thickness field shows a thickness of the boundary dielectric.

FIG. 6B shows example contents of the boundary via table. The boundary via table has a via ID field, a net ID field, a Z position field, an XY position field, and a diameter field.

The via ID field shows a via ID of a boundary via. The net ID field shows a net ID of a net to which the boundary via belongs. The Z position field shows a dielectric ID of a dielectric in which the boundary via is formed. The XY position field shows XY coordinates of a center of the boundary via. The diameter field shows a diameter of the boundary via.

In the second aid unit 201, a partial design information storage unit 241 stores partial design information about partial board B2, and a boundary design information storage unit 242 stores boundary design information about both partial boards B1 and B2.

The partial design information includes board information, layer information, dielectric information, and component placement information that relate to partial board B2. These information is respectively stored in a board table, a layer table, a dielectric table, and a component placement table provided in the partial design information storage unit 241.

FIGS. 7A to 7D respectively show example contents of the board table, the layer table, the dielectric table, and the component placement table in the partial design information storage unit 241. The partial design information about partial board B2 is stored in these tables in the same form as the corresponding tables in the partial design information storage unit 141.

The boundary design information includes boundary dielectric information and boundary via information. These information is respectively stored in a boundary dielectric table and a boundary via table provided in the boundary design information storage unit 242.

The boundary design information stored in the boundary design information storage unit 142 and the boundary design information stored in the boundary design information storage unit 242 are maintained to have the same contents (see FIG. 6A), cooperatively by the first aid unit 101 and the second aid unit 201.

(Operations)

The following describes design aid operations performed by the design aid apparatus 1 according to commands given from the user, in detail. It is supposed here that a command is directed to the second aid unit 201, so that the cooperation between the second aid unit 201 and the first aid unit 101 is established by the second aid unit 201 activating the first aid unit 101.

It should be noted that if the same command is directed to the first aid unit 101, the cooperation between the first aid unit 101 and the second aid unit 201 is established by the first aid unit 101 activating the second aid unit 201.

(Boundary Via Placement Operation)

A boundary via placement operation is performed cooperatively by the boundary via placement unit 251, the intersection judgment unit 161, and the data synchronization unit 162.

The boundary via placement unit 251 is activated by a boundary via placement command (e.g. a command to add or move a boundary via). The boundary via placement unit 251 judges whether an obstacle exists to placement of a boundary via designated by the boundary via placement command, in conjunction with the intersection judgment unit 161. If no obstacle exists, the boundary via placement unit 251 stores boundary via information showing the placement of the boundary via, to the boundary design information storage unit 242. The boundary via placement unit 251 also stores the boundary via information to the boundary design information storage unit 142 in conjunction with the data synchronization unit 162. If an obstacle exists, the boundary via placement unit 251 has the display unit 220 display a message that the boundary via cannot be placed.

Figure 8:
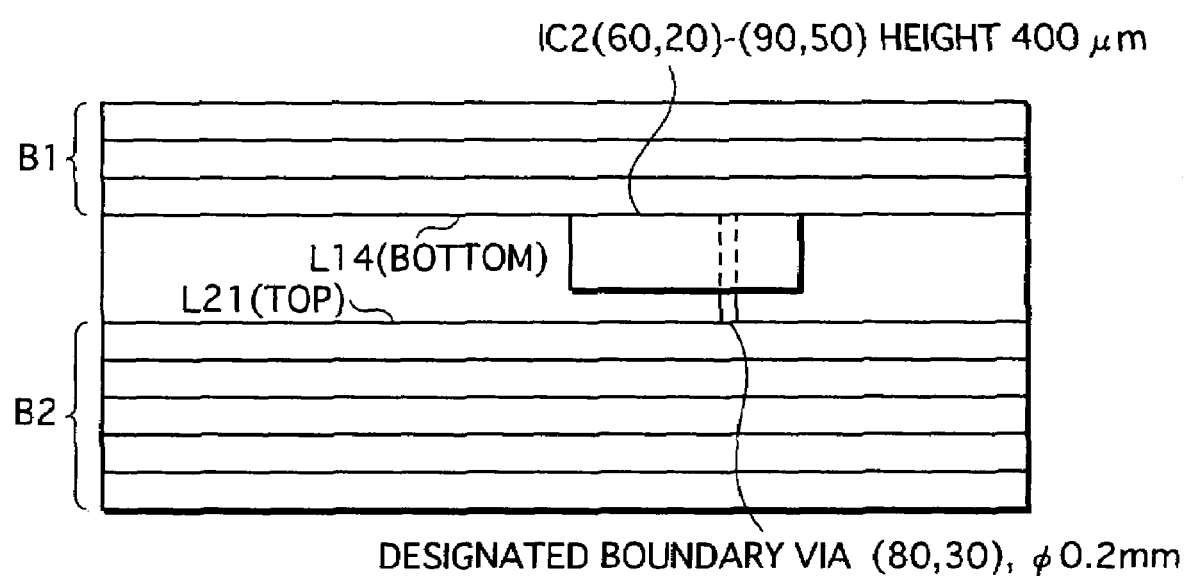
FIG. 8 is a front view showing a position of a boundary via which is designated to be placed.

FIG. 8 shows an example of placement of a designated boundary via. In the drawing, a placement area of the boundary via has a diameter of 0.2 mm and is centered on the coordinates (80,30) from the top layer of partial board B2 to the bottom layer of partial board B1. The placement of the boundary via into this placement area is obstructed by component IC2 mounted on the bottom layer of partial board B1. However, since the user has no concern with objects placed to partial board B1, he or she may instruct such impossible placement.

Figure 9:
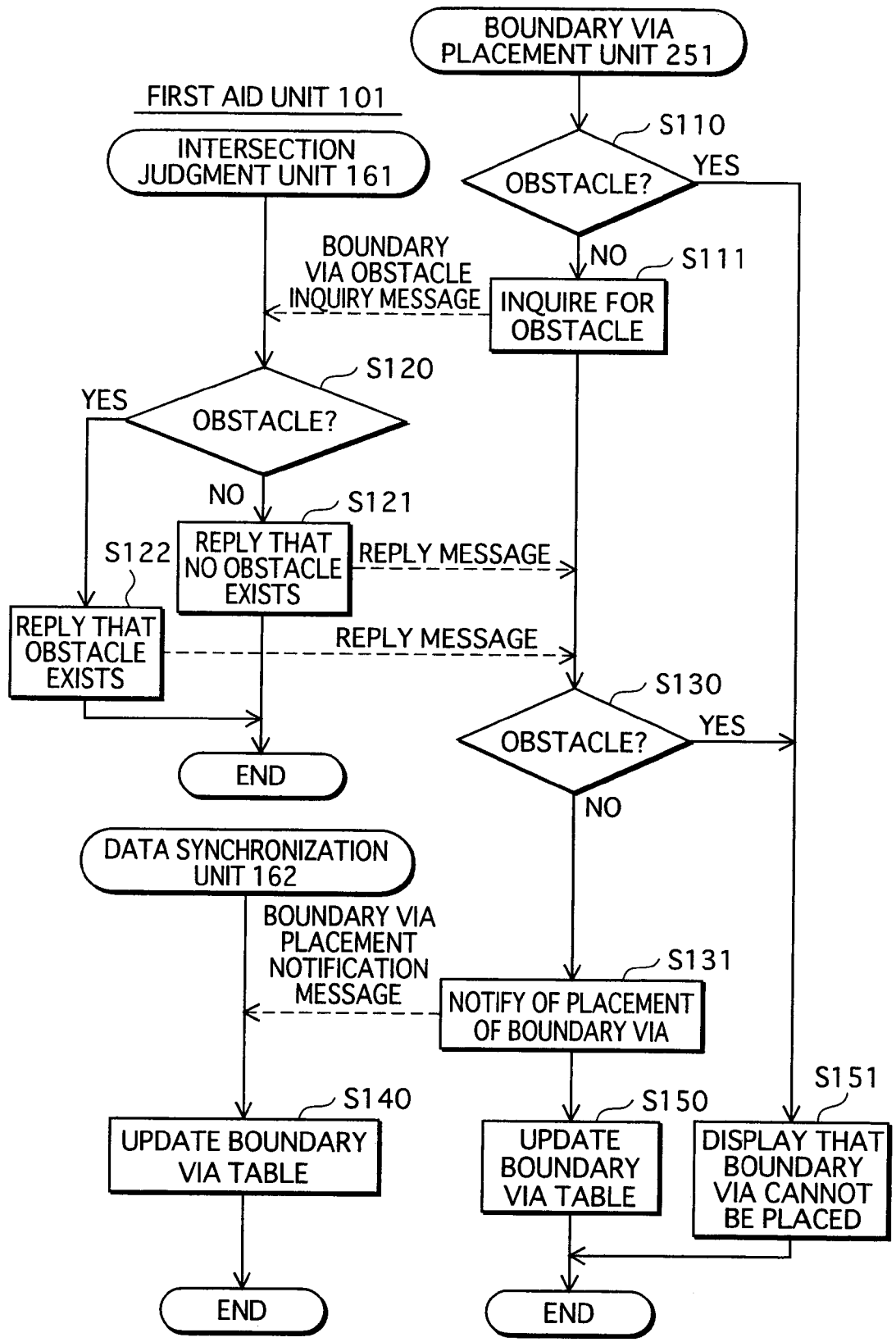
FIG. 9 is a flowchart showing a boundary via placement operation.

FIG. 9 is a flowchart showing a main part of the boundary via placement operation.

FIG. 10 shows an example of a boundary via obstacle inquiry message sent from the boundary via placement unit 251 to the intersection judgment unit 161 in the boundary via placement operation.

FIG. 11 shows an example of a boundary via placement notification message sent from the boundary via placement unit 251 to the data synchronization unit 162 in the boundary via placement operation.

The boundary via placement operation is explained step by step below.

(Step S110) The boundary via placement unit 251 searches the component placement table in the partial design information storage unit 241, for component placement information whose Z position field shows "TOP". The boundary via placement unit 251 also searches the boundary via table in the boundary design information storage unit 242, for boundary via information whose Z position field shows "SD1". If the placement area of the designated boundary via intersects with a placement area of any of a component and a boundary via found as a result of the search, the boundary via placement unit 251 judges that an obstacle exists, and proceeds to step S151.

Here, the placement areas of the objects involved in the intersection judgment are all in contact with the top layer of partial board B2. Accordingly, the intersection judgment can be made by checking whether an XY cross section of the placement area of the designated boundary via intersects with any of XY cross sections of the placement areas of the component and the boundary via found as a result of the search.

(Step S111) The boundary via placement unit 251 sends a boundary via obstacle inquiry message (see FIG. 10) to the intersection judgment unit 161. The boundary via obstacle inquiry message indicates an area where the designated boundary via is located outside partial board B2, and inquires of the intersection judgment unit 161 whether any object managed by the first aid unit 101 exists in that area.

(Step S120) The intersection judgment unit 161 receives the boundary via obstacle inquiry message, and searches the component placement table in the partial design information storage unit 141 for component placement information whose Z position field shows "BOTTOM". If the area indicated by the boundary via obstacle inquiry message intersects with a placement area of a component found as a result of the search, the intersection judgment unit 161 judges that an obstacle exists. The intersection judgment unit 161 proceeds to step S121 or S122 depending on a result of the judgment.

Here, the placement areas of the objects involved in the intersection judgment are all in contact with the bottom layer of partial board B1. Accordingly, the intersection judgment can be made by checking whether an XY cross section of the placement area of the designated boundary via intersects with an XY cross section of the placement area of the component found as a result of the search.

(Step S121) The intersection judgment unit 161 sends a reply message that no obstacle exists, to the boundary via placement unit 251.

(Step S122) The intersection judgment unit 161 sends a reply message that an obstacle exists, to the boundary via placement unit 251.

(Step S130) The boundary via placement unit 251 receives a reply message. If the received reply message indicates that an obstacle exists, the boundary via placement unit 251 proceeds to step S151. Otherwise, the boundary via placement unit 251 proceeds to step S131.

(Step S131) The boundary via placement unit 251 sends a boundary via placement notification message (see FIG. 11) indicating the placement area of the designated boundary via, to the data synchronization unit 162.

(Step S140) The data synchronization unit 162 receives the boundary via placement notification message. The data synchronization unit 162 adds boundary via information showing the placement area of the designated boundary via to the boundary via table in the boundary design information storage unit 142, or replaces existing information in the boundary via table with this boundary via information.

(Step S150) The boundary via placement unit 251 adds the boundary via information showing the placement area of the designated boundary via to the boundary via table in the boundary design information storage unit 242, or replaces existing information in the boundary via table with this boundary via information.

(Step S151) The boundary via placement unit 251 has the display unit 220 display a message that the designated boundary via cannot be placed.

(Component Placement Operation)

A component placement operation is performed cooperatively by the component placement unit 252 and the intersection judgment unit 161.

The component placement unit 252 is activated by a component placement command (e.g. a command to add or move a component). The component placement unit 252 judges whether an obstacle exists to placement of a component designated by the component placement command, in conjunction with the intersection judgment unit 161. If no obstacle exists, the component placement unit 252 stores component placement information showing the placement of the component to the partial design information storage unit 241. If an obstacle exists, the component placement unit 252 has the display unit 220 display a message that the component cannot be placed.

Figure 12:
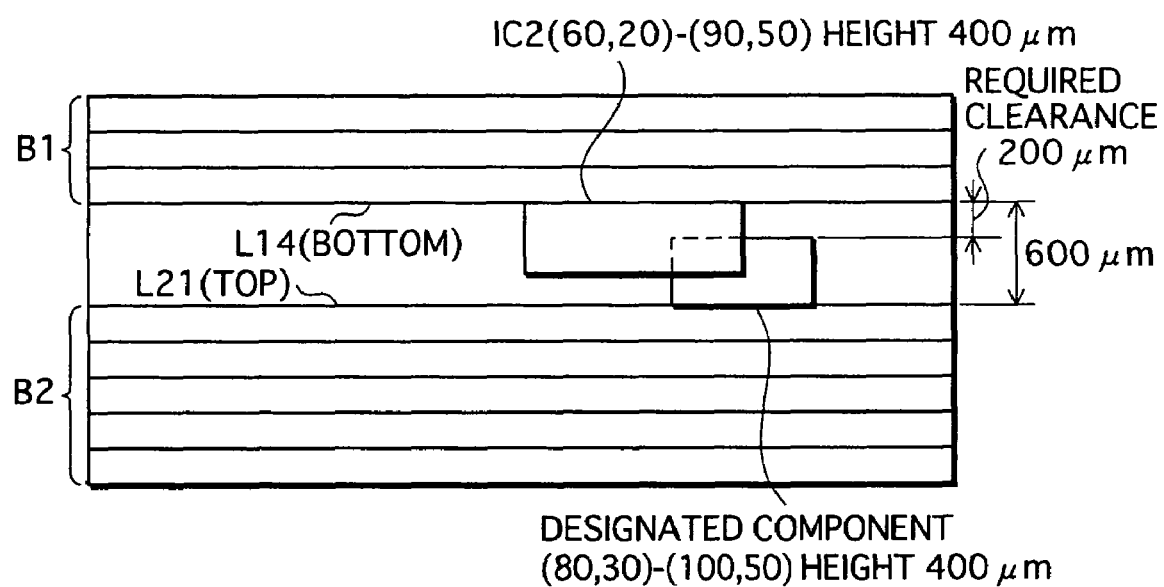
FIG. 12 is a front view showing a position of a component which is designated to be placed.

FIG. 12 shows an example of placement of a designated component. In the drawing, a placement area of the component has a height of 400 μm and a base whose opposite angles are the two points (80,30) and (100,50) on the top layer of partial board B2. The placement of the component into this placement area is obstructed by component IC2 mounted on partial board B1. However, since the user has no concern with objects placed to partial board B1, he or she may instruct such impossible placement.

Figure 13:
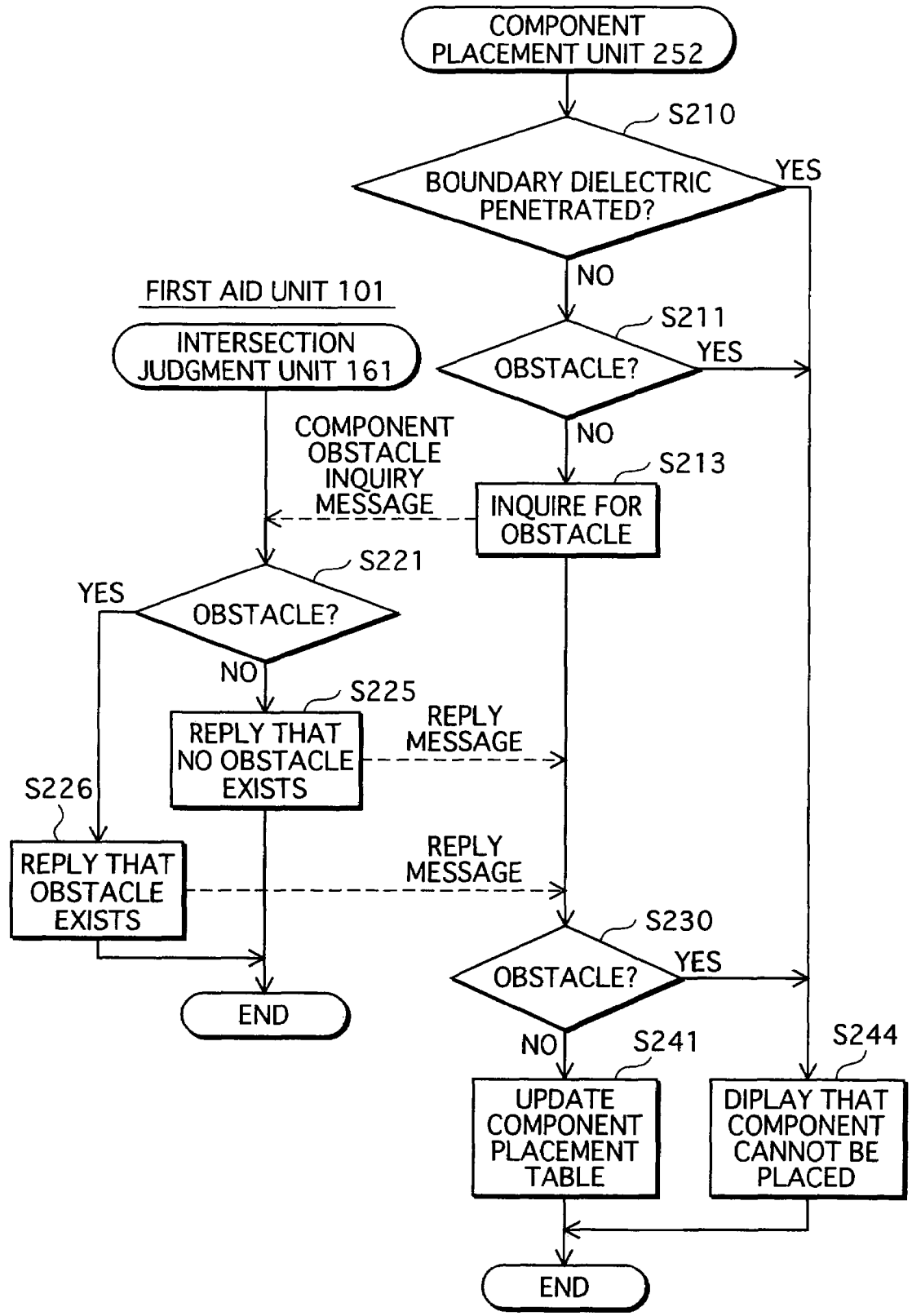
FIG. 13 is a flowchart showing a component placement operation.

FIG. 13 is a flowchart showing a main part of the component placement operation.

FIG. 14 shows an example of a component obstacle inquiry message sent from the component placement unit 252 to the intersection judgment unit 161 in the component placement operation.

The component placement operation is explained step by step below.

(Step S210) If a height of the placement area of the designated component is greater than the thickness of boundary dielectric SD1 shown in the boundary dielectric table in the boundary design information storage unit 242, the component placement unit 252 judges that the placement area of the designated component penetrates through boundary dielectric SD1, and proceeds to step S244. This judgment is made to prevent placement of such a component that penetrates through boundary dielectric SD1 and enters into partial board B1, based on the assumption that embedment of a component in the dielectrics of partial board B1 is prohibited.

(Step S211) The component placement unit 252 searches the component placement table in the partial design information storage unit 241, for component placement information whose Z position field shows "TOP". The component placement unit 252 also searches the boundary via table in the boundary design information storage unit 242, for boundary via information whose Z position field shows "SD1". If the placement area of the designated component intersects with a placement area of any of a component and a boundary via found as a result of the search, the component placement unit 252 judges that an obstacle exists, and proceeds to step S244.

Here, the placement area of the objects involved in the intersection judgment are all in contact with the top layer of partial board B2. Accordingly, the intersection judgment can be made by checking whether an XY cross section of the placement area of the designated component intersects with any of XY cross sections of the placement areas of the component and boundary via found as a result of the search.

(Step S213) The component placement unit 252 sends a component obstacle inquiry message (see FIG. 14) to the intersection judgment unit 161. The component obstacle inquiry message indicates an area where the designated component is located outside partial board B2, and inquires of the intersection judgment unit 161 whether any object managed by the first aid unit 101 exists in this area.

(Step S221) The intersection judgment unit 161 receives the component obstacle inquiry message, and searches the component placement table in the partial design information storage unit 141 for component placement information whose Z position field shows "BOTTOM". If the area indicated by the component obstacle inquiry message intersects with a placement area of a component found as a result of the search, the intersection judgment unit 161 judges that an obstacle exists. The intersection judgment unit 161 proceeds to step S225 or S226, depending on a result of the judgment.

In more detail, the intersection judgment unit 161 judges the two areas as intersecting with each other, if XY cross sections of the two areas intersect with each other and also a sum of heights of the two areas is greater than the thickness of boundary dielectric SD1.

As mentioned earlier, a placement area of a component can be set larger than a nominal size of the component. In this intersection judgment, the placement area may be further extended in the Z direction. There are cases where a dielectric of a predetermined thickness is required to be provided between components, for a reason related to manufacturing. By extending the placement area in the Z direction in this intersection judgment, it is possible to allow for such a predetermined thickness.

Also, the intersection judgment may be made using heights of components and a minimum distance to be provided between components in the Z direction. For example, let h1 and h2 be the heights of two components, s be the minimum distance, and t be the thickness of boundary dielectric SD1. This being the case, the placement areas of the two components are judged as intersecting with each other if $t<h1+h2+s$.

(Step S225) The intersection judgment unit 161 sends a reply message that no obstacle exists, to the component placement unit 252.

(Step S226) The intersection judgment unit 161 sends a reply message that an obstacle exists, to the component placement unit 252.

(Step S230) The component placement unit 252 receives a reply message. If the received reply message indicates that an obstacle exists, the component placement unit 252 proceeds to step S244.

(Step S241) The component placement unit 252 adds component placement information showing the placement area of the designated component to the component placement table in the partial design information storage unit 241, or replaces existing information in the component placement table with this component placement information.

(Step S244) The component placement unit 252 has the display unit 220 display a message that the designated component cannot be placed.

(Fast-Response Component Placement Operation)

A fast-response component placement operation is a modification to the component placement operation shown in FIG. 13, and is performed cooperatively by the component placement unit 252 and the data synchronization unit 162.

This component placement operation differs from the component placement operation shown in FIG. 13, on the following two points (1) and (2).

(1) Notification information about placement of an object managed by the first aid unit 101 is sent from the first aid unit 101 and stored in the partial design information storage unit 241 beforehand. This being so, the component placement unit 252 independently judges whether the object is an obstacle to placement of a component designated by the user, with reference to the notification information.

(2) The component placement unit 252 sends notification information about the placement of the designated component to the first aid unit 101 and stores it to the partial design information storage unit 141 in cooperation with the data synchronization unit 162.

For example, notification information mentioned here is stored in a height reservation table provided in each of the partial design information storage units 141 and 241, as height reservation information.

FIG. 15 shows example contents of the height reservation table in the partial design information storage unit 241. The height reservation table has a Z position field, an XY position field, and a height field.

The Z position field shows a dielectric ID of a boundary dielectric in which an object is contained. The XY position field shows XY coordinates of opposite angles of an XY cross section of a placement area of the object. The height field shows a height of the object in the boundary dielectric.

Such height reservation information indicates an area, in boundary dielectric SD1, that is occupied by a component mounted on partial board B1. This area is equivalent to an area where the component is located outside partial board B1. The second aid unit 201 manages this area as a reserved area in which other objects cannot be placed.

Figure 16:
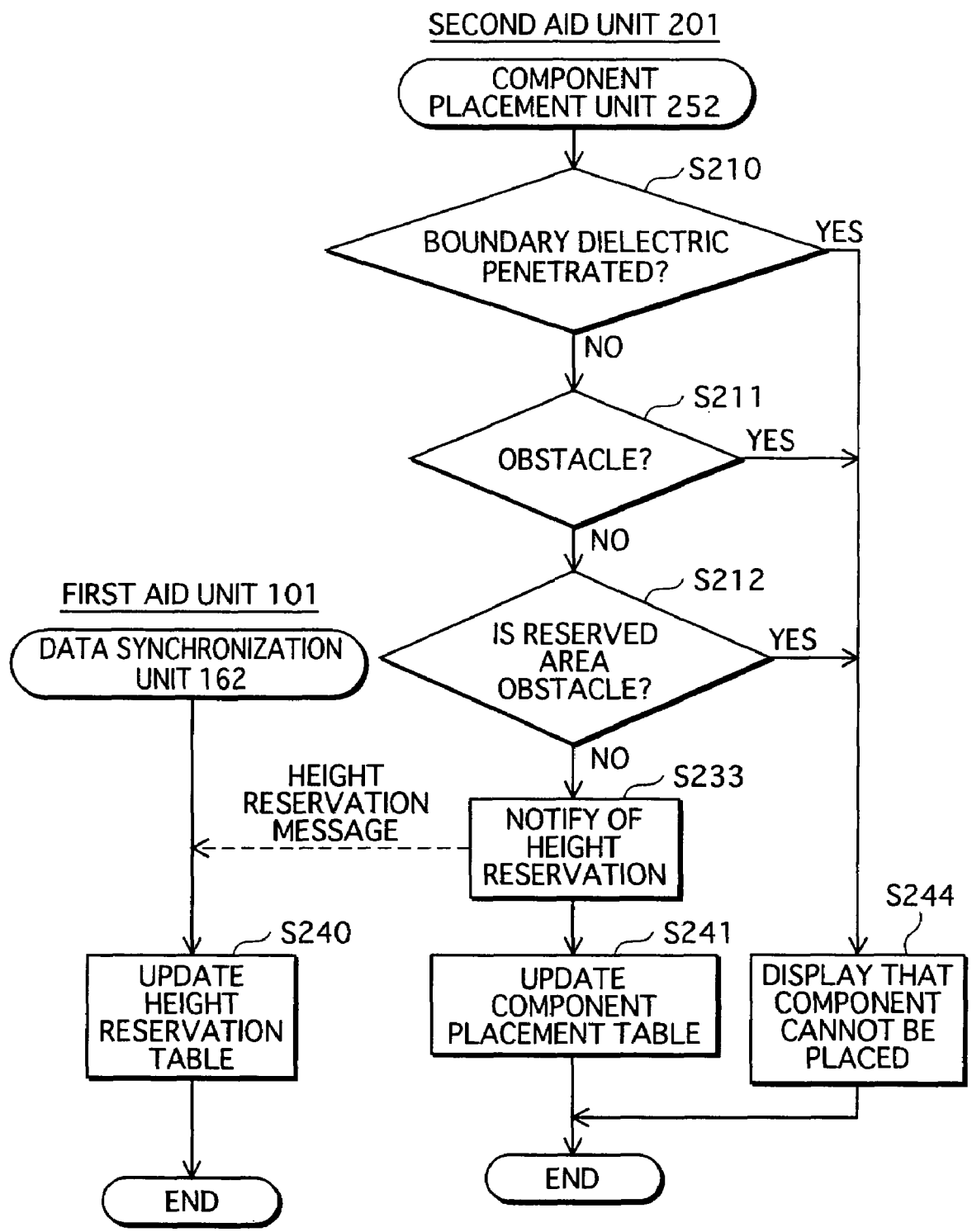
FIG. 16 is a flowchart showing a fast-response component placement operation.

FIG. 16 is a flowchart showing a main part of the fast-response component placement operation.

FIG. 17 shows an example of a height reservation message sent from the component placement unit 252 to the data synchronization unit 162 in the fast-response component placement operation.

The fast-response component placement operation is explained below, focusing on the differences from the component placement operation shown in FIG. 13. Note here that steps which are the same as those in FIG. 13 have been given the same reference numerals and their explanation ahs been omitted.

(Step S212) The component placement unit 252 searches the height reservation table in the partial design information storage unit 241 for height reservation information whose Z position field shows "SD1". If a placement area of a component designated by the user intersects with a reserved area shown by the height reservation information, the component placement unit 252 judges that the reserved area is an obstacle, and proceeds to step S244. This intersection judgment can be performed in the same way as in step S221.

(Step S233) Upon judging that the reserved area is not an obstacle, the component placement unit 252 sends a height reservation message (see FIG. 17) indicating an area where the designated component is located outside partial board B2, to the data synchronization unit 162.

(Step S240) The data synchronization unit 162 receives the height reservation message, and adds height reservation information showing the area indicated by the height reservation message to the height reservation table in the partial design information storage unit 141.

In this example, height reservation information is used as a specific example of notification information. Alternatively, height limitation information, which shows a value obtained by subtracting a height of a placement area of a component in boundary dielectric SD1 from the thickness of boundary dielectric SD1, may equally be used as notification information.

Note here that the height reservation information referenced by the component placement unit 252 in step S212 has been sent from the component placement unit 152 and stored in the partial design information storage unit 241 beforehand, by the same fast-response component placement operation performed in an opposite direction.

(Penetrative Component Placement Operation)

A penetrative component placement operation is a modification to the component placement operation shown in FIG. 13, and is performed cooperatively by the component placement unit 252, the intersection judgment unit 161, and the penetration processing unit 163.

The penetrative component placement operation differs from the component placement operation shown in FIG. 13, in that placement of a component that penetrates through boundary dielectric SD1 and enters into partial board B1 is permitted (hereafter such placement is called penetrative placement).

Figure 18:
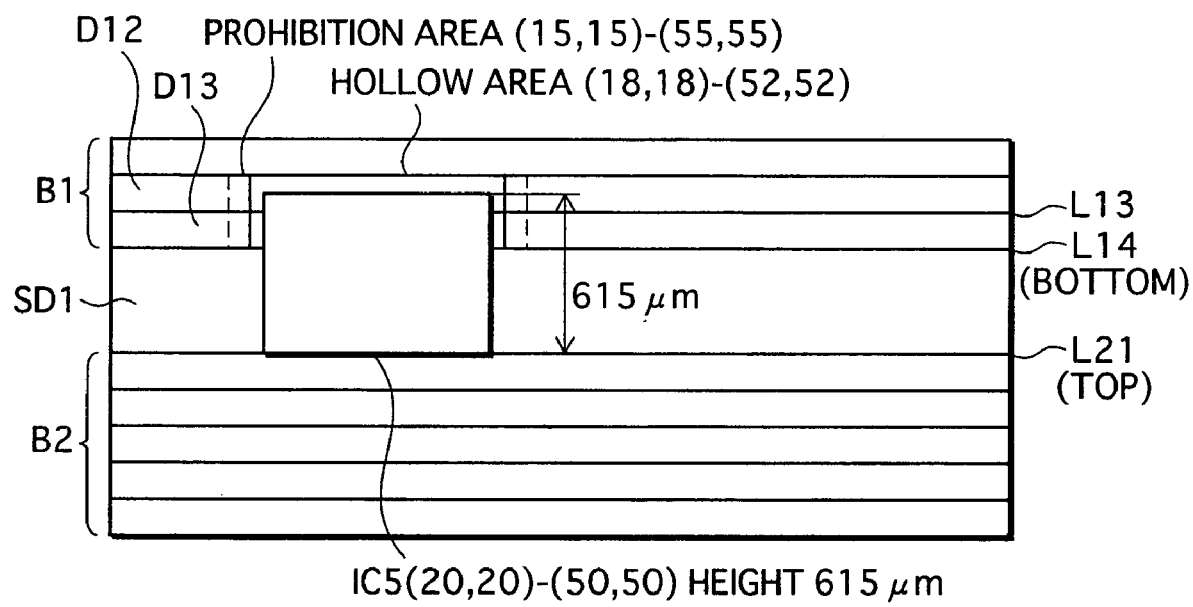
FIG. 18 is a front view showing positions of a penetrative-placed component, a hollow area, and a prohibition area.

FIG. 18 is a front view showing a penetrative-placed component, and a hollow area and a prohibition area which are set for the penetrative-placed component. In the drawing, a placement area of component IC5 mounted on the top layer of partial board B2 penetrates through boundary dielectric SD1 and enters into dielectrics D12 and D13 in partial board B1.

Figure 19:
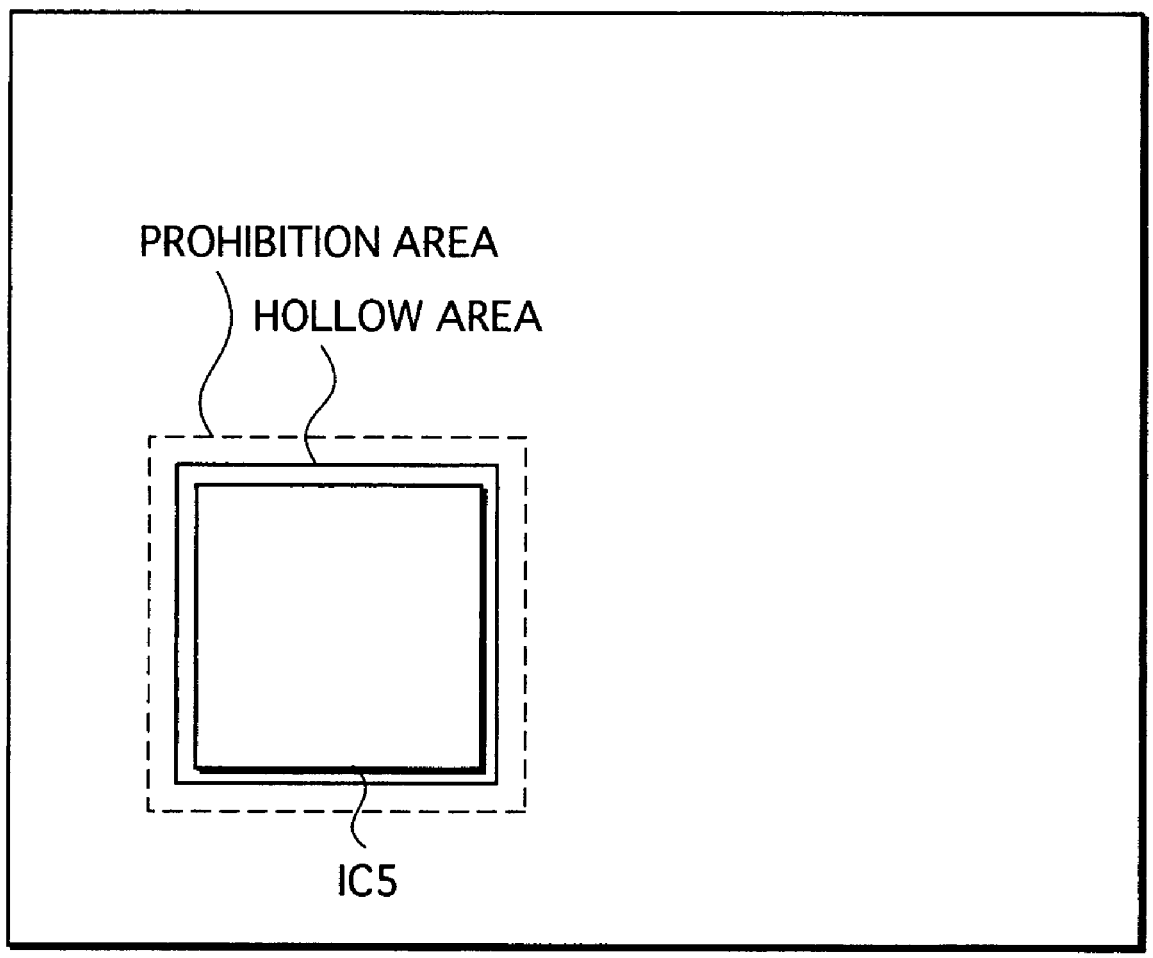
FIG. 19 is a top view showing the hollow area and the prohibition area in layer L13 shown in FIG. 18.

FIG. 19 is a top view corresponding to the front view of FIG. 18.

In this example, the hollow area is set in dielectrics D12 and D13. The hollow area is such an area where a dielectric material is not provided to create a space for containing component IC5. The hollow area is set to be larger than a nominal size of component IC5 by a predetermined size, in consideration of factors such as the board processing accuracy and the deviations in component size and positioning.

Also, the prohibition area in which placement of a component, a via, a wire, and a plane is prohibited is set in dielectrics D12 and D13 and layers L13 and L14. In particular, the prohibition area represents a slit where placement of a plane is prevented. The prohibition area is set to be larger than the hollow area by a predetermined size.

Hollow information and prohibition information which respectively show the hollow area and the prohibition area set in partial board B1 are stored in a hollow table and a prohibition table provided in the partial design information storage unit 141.

FIG. 20A shows example contents of the hollow table. The hollow table has a Z position field and an XY position field.

The Z position field shows a dielectric ID of a dielectric in which a hollow area is set. The XY position field shows XY coordinates of opposite angles of an XY cross section of the hollow area.

FIG. 20B shows example contents of the prohibition table. The prohibition table has a Z position field and an XY position field.

The Z position field shows a layer ID of a layer in which a prohibition area is set, and a dielectric ID of a dielectric in which the prohibition area is set. The XY position field shows XY coordinates of opposite angles of an XY cross section of the prohibition area.

In the same fashion, hollow information and prohibition information which respectively show a hollow area and a prohibition area set in partial board B2 are stored in a hollow table and a prohibition table provided in the partial design information storage unit 241.

Figure 21:
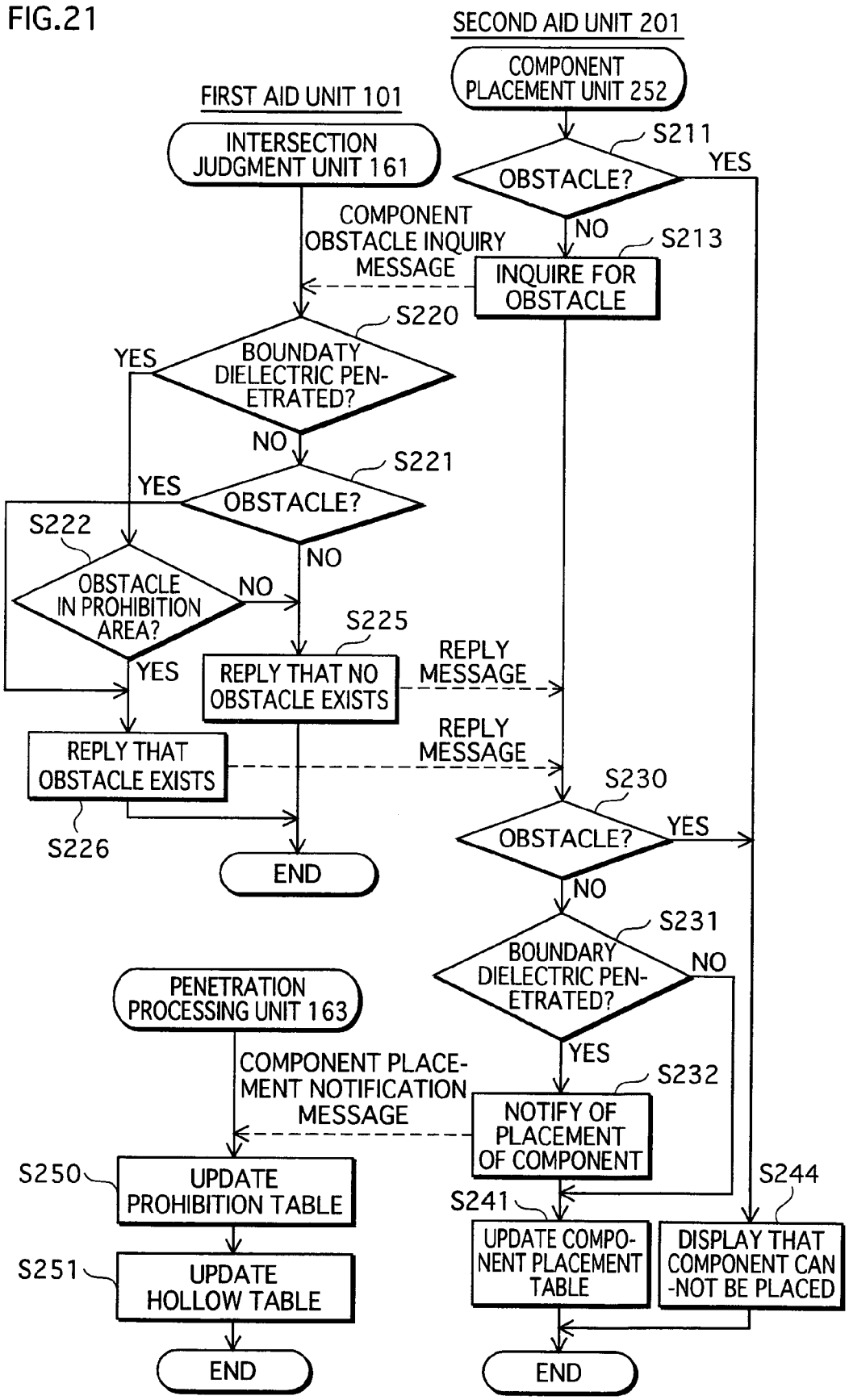
FIG. 21 is a flowchart showing a penetrative component placement operation.

FIG. 21 is a flowchart showing a main part of the penetrative component placement operation.

This penetrative component placement operation is explained below, focusing on the differences from the component placement operation shown in FIG. 13. Note here that steps which are the same as those in FIG. 13 have been given the same reference numerals and their explanation has been omitted.

(Step S220) The intersection judgment unit 161 receives a component obstacle inquiry message (see FIG. 14). If a height of a placement area of a designated component shown by the component obstacle inquiry message is greater than the thickness of boundary dielectric SD1 shown in the boundary dielectric table in the boundary design information storage unit 142, the intersection judgment unit 161 judges that the placement area penetrates through boundary dielectric SD1, and proceeds to step S222. Otherwise, the intersection judgment unit 161 proceeds to step S221 (described above).

(Step S222) The intersection judgment unit 161 calculates a prohibition area based on the component obstacle inquiry message. The prohibition area can be calculated as follows. First, the intersection judgment unit 161 calculates a rectangular prism. This rectangular prism has a base with opposite angles shown by the XY position field in the component obstacle inquiry message, and a height obtained by subtracting the thickness of boundary dielectric SD1 from a height shown by the height field in the component obstacle inquiry message. The intersection judgment unit 161 then extends this rectangular prism by a predetermined size, to obtain the prohibition area. The intersection judgment unit 161 searches the component placement table in the partial design information storage unit 141 for a component whose placement area intersects with this prohibition area. If such a component exists, the intersection judgment unit 161 judges that an obstacle exists, and proceeds to step S226. Otherwise, the intersection judgment unit 161 proceeds to step S225.

In this example, the intersection judgment unit 161 judges whether a component exists in the prohibition area, but this is not a limit for the present invention. The intersection judgment unit 161 may also judge whether an object, such as a via, a wire, and a plane, other than a component exists in the prohibition area.

(Step S231) The component placement unit 252 receives a reply message. If the received reply message indicates that no obstacle exists, the component placement unit 252 judges whether the placement area of the designated component penetrates through boundary dielectric SD1. If the placement area of the designated component penetrates through boundary dielectric SD1, the component placement unit 252 proceeds to step S232.

(Step S232) The component placement unit 252 sends a component placement notification message indicating an area where the placement area of the designated component is located outside partial board B2, to the penetration processing unit 163. For instance, the component placement notification message can be expressed in the same form as the component obstacle inquiry message.

(Step S250) The penetration processing unit 163 receives the component placement notification message. The prohibition information generation unit 164 calculates the prohibition area based on the component placement notification message, in the same way as in step S222. The prohibition information generation unit 164 adds prohibition information showing the prohibition area, to the prohibition table in the partial design information storage unit 141.

(Step S251) The hollow information generation unit 165 calculates a hollow area based on the component placement notification message, and adds hollow information showing the hollow area to the hollow table in the partial design information storage unit 141.

(First Interference-Avoidance Component Placement Operation)

A first interference-avoidance component placement operation is a modification to the component placement operation shown in FIG. 13, and is performed cooperatively by the component placement unit 252 and the intersection judgment unit 161.

The first interference-avoidance component placement operation differs from the component placement operation shown in FIG. 13, in that if the intersection judgment unit 161 judges that an obstacle exists, the component placement unit 252 sets an alternative area and places a designated component to the alternative area.

Figure 22:
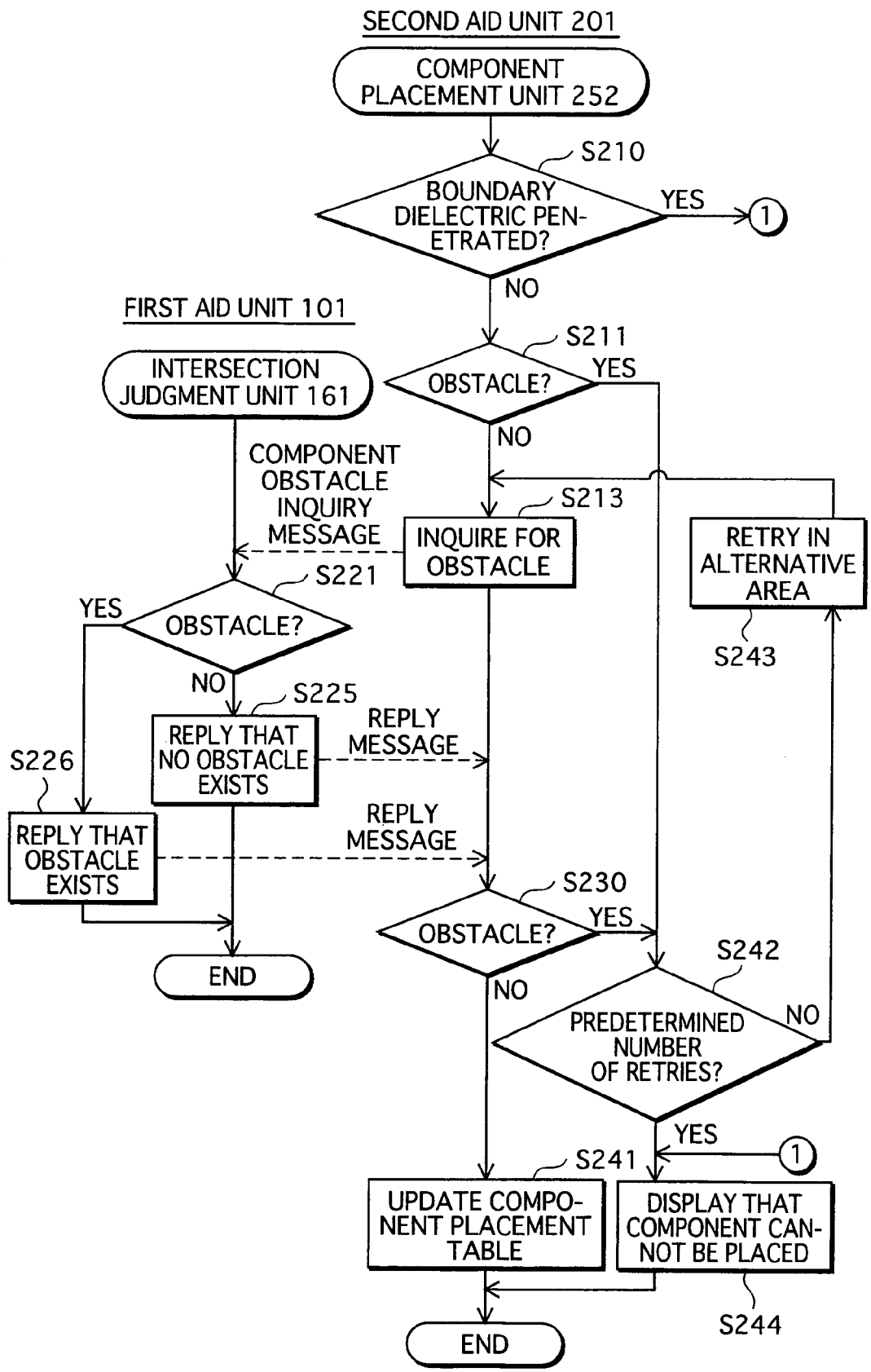
FIG. 22 is a flowchart showing a first interference-avoidance component placement operation.

FIG. 22 is a flowchart showing a main part of the first interference-avoidance component placement operation.

This first interference-avoidance component placement operation is explained below, focusing on the differences from the component placement operation shown in FIG. 13.

Note here that steps which are the same as those in FIG. 13 have been given the same reference numerals and their explanation has been omitted.

(Step S242) When an obstacle exists, the component placement unit 252 judges that an alternative area cannot be set and proceeds to step S244 if a predetermined number of retries have already been performed. Otherwise, the component placement unit 252 proceeds to step S243.

(Step S243) The component placement unit 252 sets an alternative area in a predetermined neighborhood of the original placement area of the designated component, and retries to place the designated component in the alternative area.

(Step S241) When no obstacle exists in the original placement area, the component placement unit 252 adds component placement information showing the original placement area to the component placement table in the partial design information storage unit 241, or replaces existing information in the component placement table with this component placement information. When no obstacle exists in the alternative area, the component placement unit 252 adds component placement information showing the alternative area to the component placement table, or replaces existing information with this component placement information.

Figure 23:
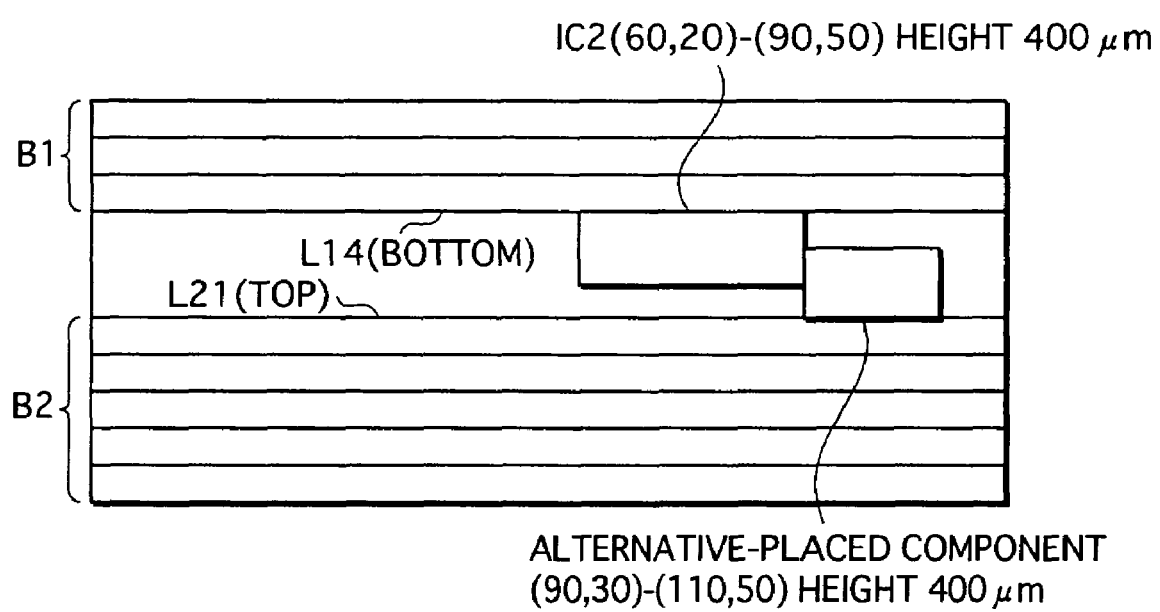
FIG. 23 is a front view showing a position of a component which is alternate-placed as a result of interference avoidance.

FIG. 23 shows a specific example of placement of a component according to this first interference-avoidance component placement operation. When the placement of the component shown in FIG. 12 is designated by the user, the component is alternative-placed as shown in FIG. 23.

The first interference-avoidance component placement operation shown in FIG. 22 may be modified as follows. The intersection judgment unit 161 notifies the component placement unit 252 of the placement area of the obstacle. The component placement unit 252 calculates an area where the placement area of the obstacle intersects with the original placement area of the designated component, and sets an alternative area that has the same shape as the original placement area and is apart from the original placement area by the calculated area.

(Second Interference-Avoidance Component Placement Operation)

A second interference-avoidance component placement operation is a modification to the component placement operation shown in FIG. 13, and is performed cooperatively by the component placement unit 252 and the intersection judgment unit 161.

The second interference-avoidance component placement operation differs from the component placement operation shown in FIG. 13, in that if the intersection judgment unit 161 judges that an obstacle exists, the intersection judgment unit 161 sets an alternative area and moves the obstacle to the alternative area.

Figure 24:
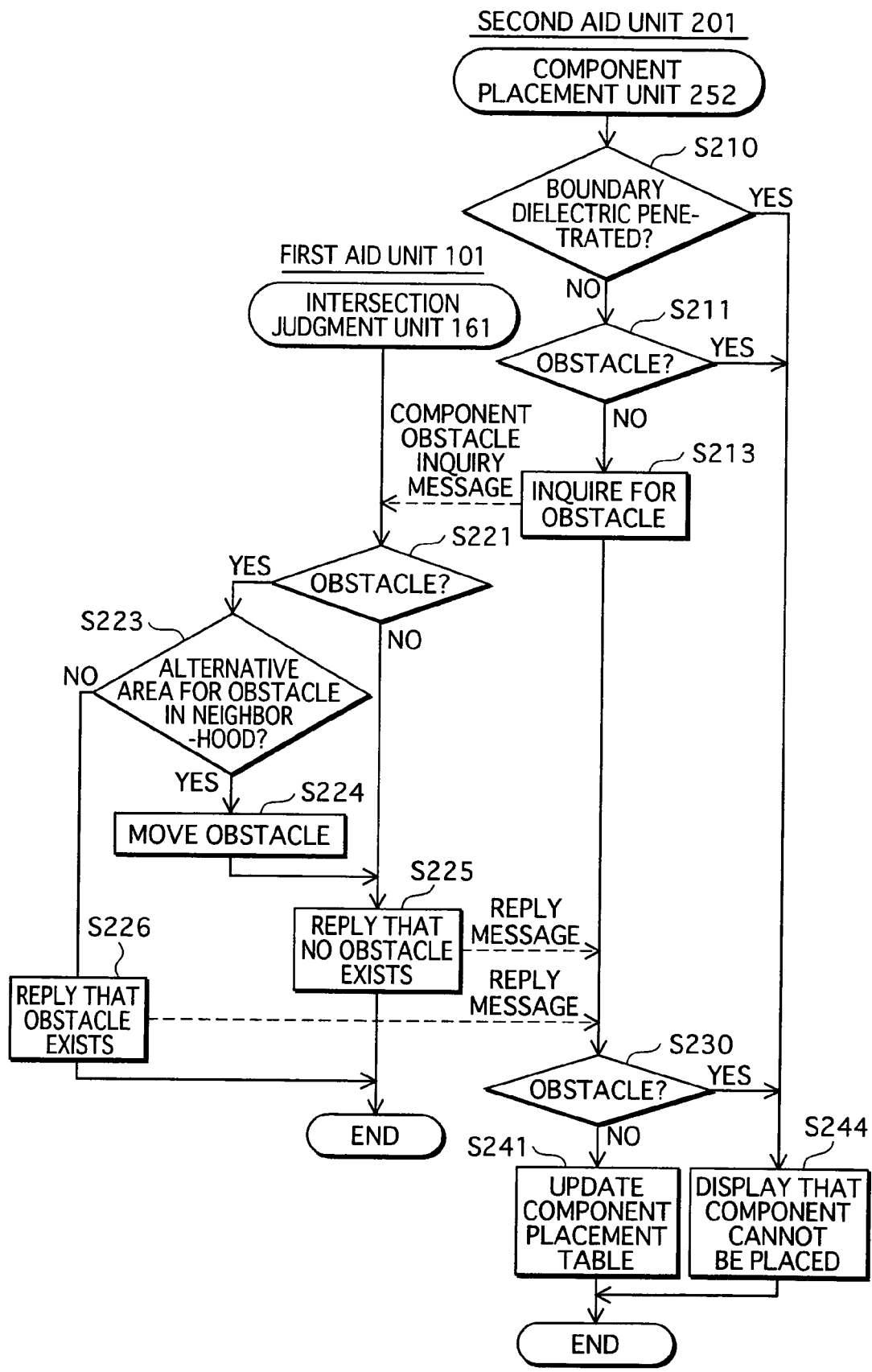
FIG. 24 is a flowchart showing a second interference-avoidance component placement operation.

FIG. 24 is a flowchart showing a main part of the second interference-avoidance component placement operation.

This second interference-avoidance component placement operation is explained below, focusing on the differences from the component placement operation shown in FIG. 13. Note here that steps which are the same as those in FIG. 13 have been given the same reference numerals and their explanation has been omitted.

(Step S223) If an obstacle exists, the intersection judgment unit 161 attempts to set an alternative area for the obstacle. If the intersection judgment unit 161 succeeds in setting the alternative area, the intersection judgment unit 161 proceeds to step S224. Otherwise, the intersection judgment unit 161 proceeds to step S226.

In detail, the intersection judgment unit 161 calculates an area where a placement area of a designated component shown by the component obstacle inquiry message intersects with the placement area of the obstacle. The intersection judgment unit 161 then sets an alternative area that has the same shape as the placement area of the obstacle and is apart from the placement area of the obstacle by the calculated area. If another obstacle exists in the alternative area, the intersection judgment unit 161 judges that the alternative area cannot be set.

(Step S224) The intersection judgment unit 161 replaces component placement information relating to the obstacle in the component placement table in the partial design information storage unit 141, with component placement information showing the alternative area.

Figure 25:
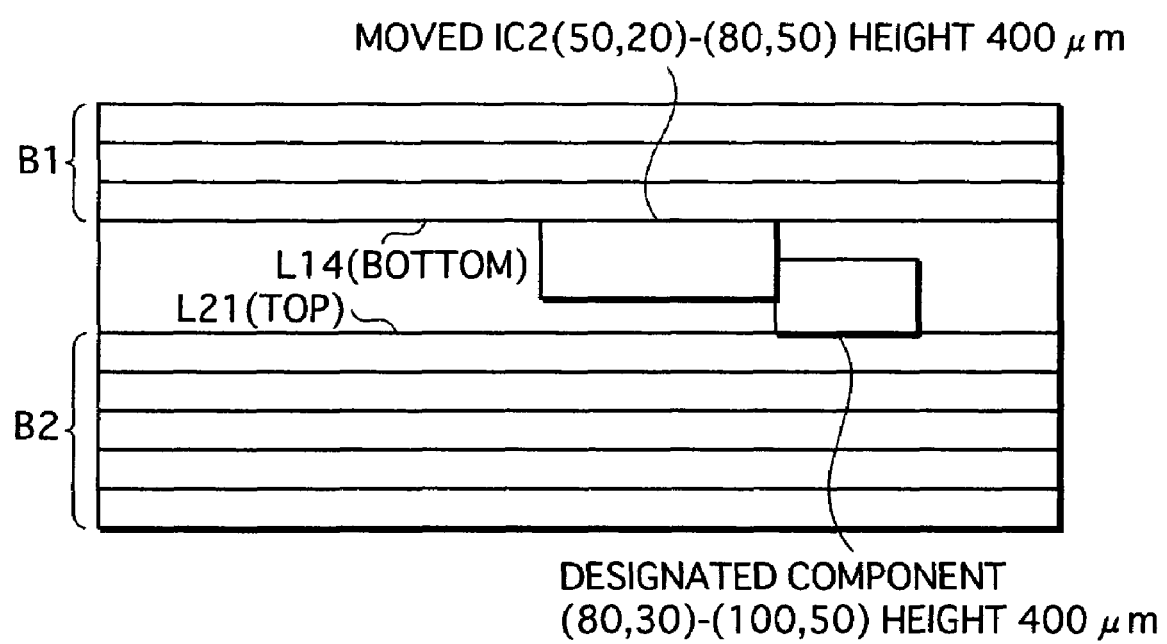
FIG. 25 is a front view showing a position of an obstacle which is moved as a result of interference avoidance.

FIG. 25 shows a specific example of a placement result according to the second interference-avoidance component placement operation. When the placement of the component shown in FIG. 12 is designated by the user, component IC2 which obstructs the placement is moved as shown in FIG. 25.

(Batch Check Operation)

A batch check operation is performed cooperatively by the batch check unit 253 and the intersection judgment unit 161.

The batch check unit 253 is activated by a batch check command. The batch check unit 253 judges whether any object managed by the first aid unit 101 is an obstacle when placing each individual component according to component placement information stored in the partial design information storage unit 241, in conjunction with the intersection judgment unit 161. This judgment made on each individual component in the batch check operation is the same as the judgment made on a designated component in the component placement operation in FIG. 13.

For example, in the case where component placement commands are accepted without judging the presence or absence of obstacles to complete data inputs quickly, the batch check operation is later performed to collectively check the placement of components designated by the accepted commands.

The batch check operation described here relates to placement of components, though this is not a limit for the present invention. For example, batch check may equally be performed on placement of other objects such as vias, wires, and planes.

Figure 26:
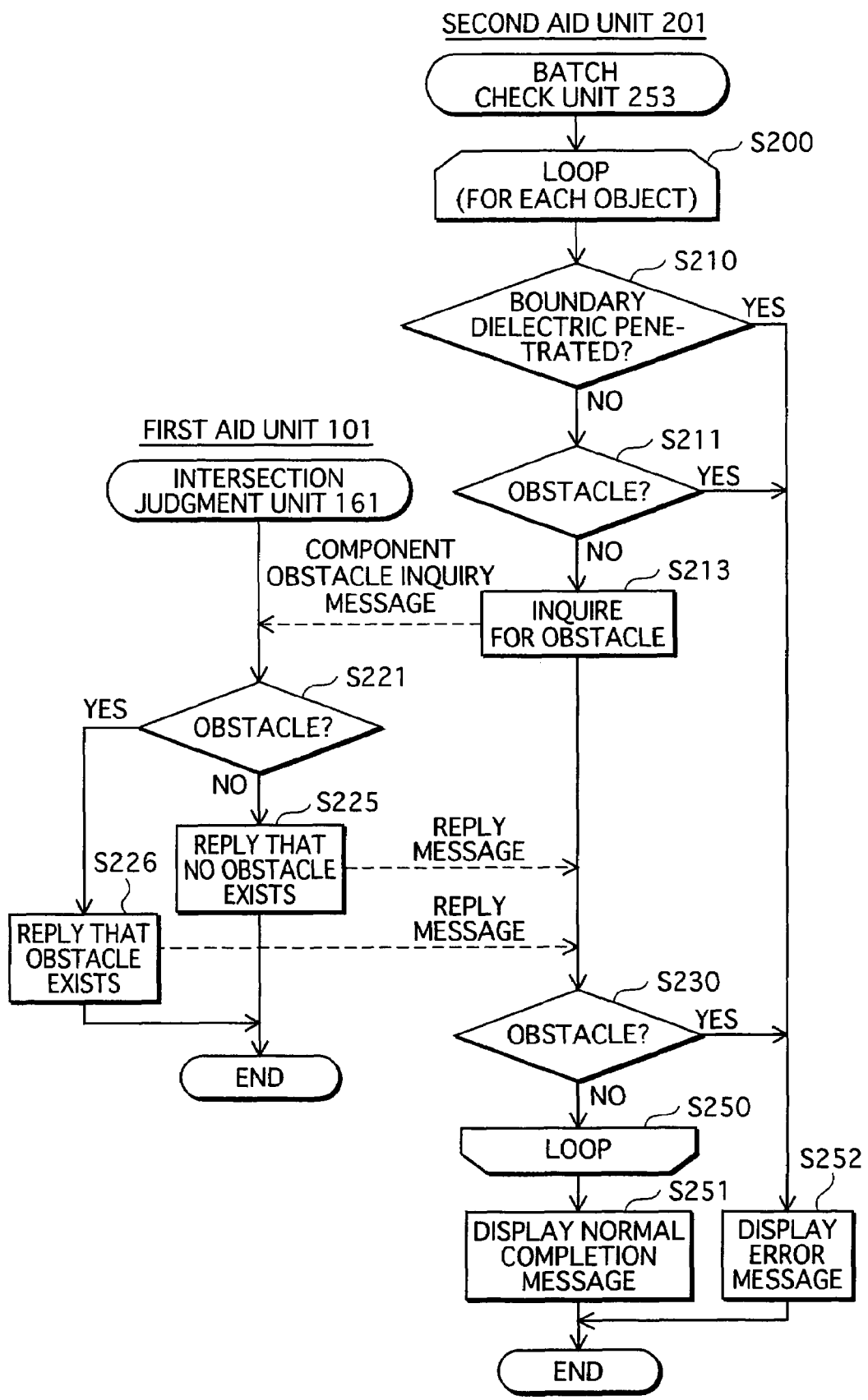
FIG. 26 is a flowchart showing a batch check operation.

FIG. 26 is a flowchart showing a main part of the batch check operation.

This batch check operation is explained below, focusing on the differences from the component placement operation shown in FIG. 13. Note here that steps which are the same as those in FIG. 13 have been given the same reference numerals and their explanation has been omitted.

(Step S200) The batch check unit 253 selects component placement information of one component from the component placement table in the partial design information storage unit 241. The batch check unit 253 performs steps S210, S211, S213, and S230, to judge whether an obstacle exists to the placement of the component according to the component placement information.

(Step S250) If no obstacle exists, the batch check unit 253 selects component placement information of another component and repeats the same procedure.

(Step S251) If no obstacle exists to the placement of all components shown in the component placement table, the batch check unit 253 has the display unit 220 display a normal completion message.

(Step S252) If an obstacle exists to the placement of any of the components shown in the component placement table, the batch check unit 253 has the display unit 220 display a message indicating the component as an error.

Here, the batch check unit 253 may activate the batch check unit 153 in the first aid unit 101, before ending the batch check operation. This enables complete check to be carried out in both the first aid unit 101 and the second aid unit 201.

(Dielectric Thickness Calculation Operation)

A dielectric thickness calculation operation is performed independently by the dielectric thickness calculation unit 254, in the case where notification information about placement of objects managed by the first aid unit 101 is stored in the partial design information storage unit 241 beforehand.

The dielectric thickness calculation unit 254 is activated by a dielectric thickness calculation command, and calculates a minimum thickness required of a boundary dielectric to contain components.

For example, in the case where component placement commands are accepted without judging the presence or absence of obstacles and without judging the penetrativeness to complete data inputs quickly, this dielectric thickness calculation operation is later carried out to calculate a minimum thickness of a boundary dielectric required to place components according to the accepted commands.

Figure 27A:
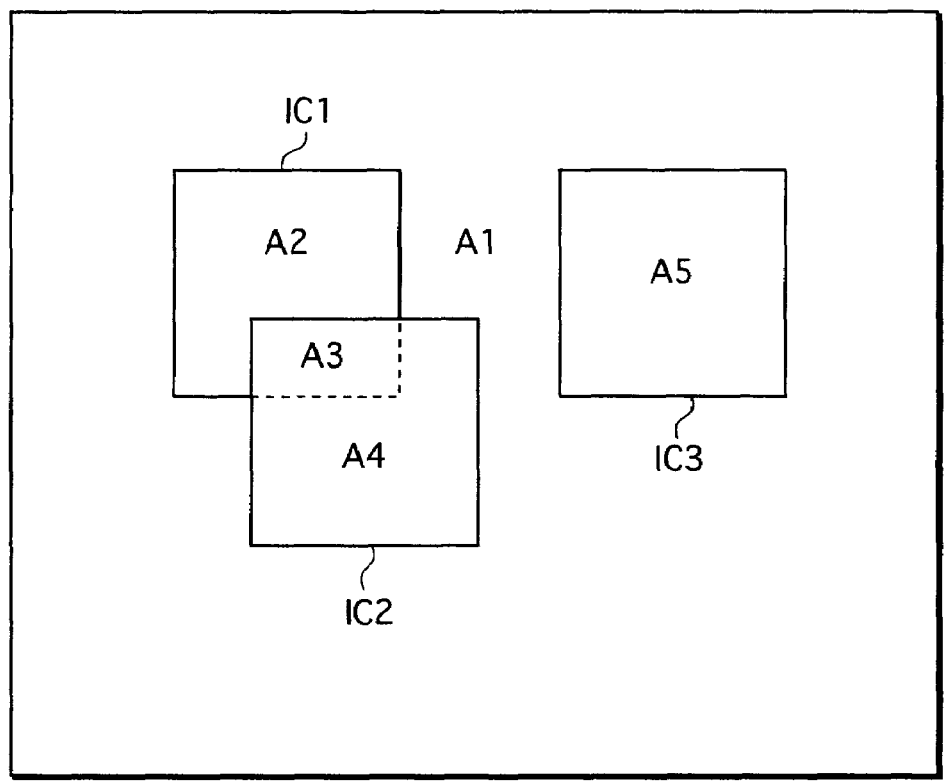
FIGS. 27A and 27B are respectively a top view and a front view showing an example of placement of components.
Figure 27B:
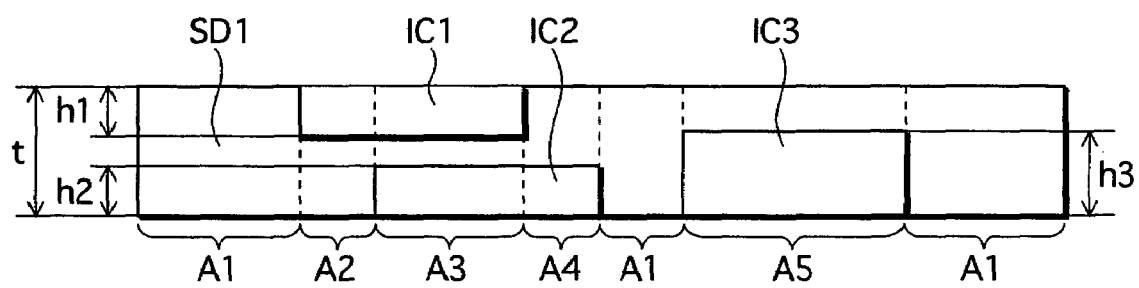

FIGS. 27A and 27B are respectively a top view and a front view showing an example of placement of components within boundary dielectric SD1. In these drawings, component IC1 is mounted on partial board B1 (not illustrated) above boundary dielectric SD1 so as to be positioned in boundary dielectric SD1, and components IC2 and IC3 are mounted on partial board B2 (not illustrated) below boundary dielectric SD1 so as to be positioned in boundary dielectric SD1.

Suppose here that height reservation information showing placement of components on partial board B1 has been stored in the height reservation table in the partial design information storage unit 241, and component placement information showing placement of components on partial board B2 has been stored in the component placement table in the partial design information storage unit 241.

Figure 28:
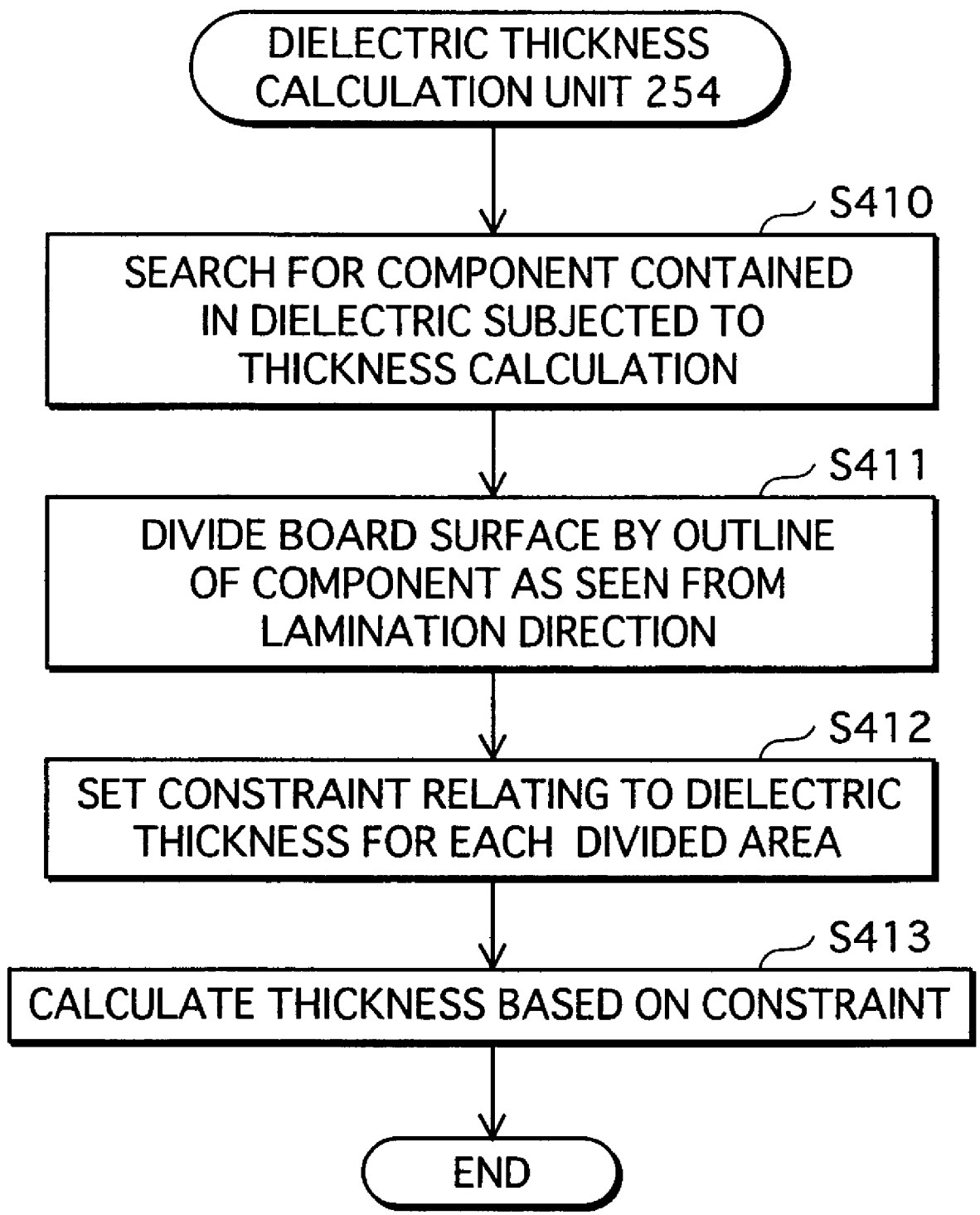
FIG. 28 is a flowchart showing a dielectric thickness calculation operation.

FIG. 28 is a flowchart showing a main part of the dielectric thickness calculation operation.

This dielectric thickness calculation operation is explained step by step below.

(Step S410) The dielectric thickness calculation unit 254 sets boundary dielectric SD1 as a dielectric subjected to thickness calculation. The dielectric thickness calculation unit 254 searches the component placement table in the partial design information storage unit 241, for component placement information whose Z position field shows "TOP". The dielectric thickness calculation unit 254 also searches the height reservation table in the partial design information storage unit 241, for height reservation information whose Z position field shows "SD1".

(Step S411) The dielectric thickness calculation unit 254 divides the board surface by each rectangle whose opposite angles have coordinates shown by the XY position field in the information found as a result of the search. In the example shown in FIGS. 27A and 27B, the board surface is divided into areas A1 to A5.

(Step S412) The dielectric thickness calculation unit 254 sets, for each divided area, a constraint formula on the thickness of boundary dielectric SD1 necessary for containing components.

In the example of FIGS. 27A and 27B, let h1, h2, and h3 be heights of components IC1, IC2, and IC3 respectively, s be a minimum distance required between components and between layers in the Z direction, and t be the thickness of boundary dielectric SD1. This being so, the constraint formulas for areas A1 to A5 are set as follows:

| | |
|---|---|
| $s \leq t$ | (area A1) |
| $h1 + s \leq t$ | (area A2) |
| $h1 + h2 + s \leq t$ | (area A3) |
| $h2 + s \leq t$ | (area A4) |
| $h3 + s \leq t$ | (area A5) |

(Step S413) The dielectric thickness calculation unit 254 calculates the thickness of boundary dielectric SD1, based on the constraint formulas set for the divided areas.

In the above example, solving the constraint formulas for areas A1 to A5 such that the relational inequality h3<h1+h2 about the heights of the components holds true yields $$t \geq h1+h2+s$$

Hence a minimum value of t satisfying the constraint formulas is $$t = h1+h2+s$$

The dielectric thickness calculation operation described above is based on the assumption that height reservation information showing placement of components on partial board B1 is stored in the height reservation table in the partial design information storage unit 241 beforehand. Alternatively, the dielectric thickness calculation unit 254 may perform the dielectric thickness calculation operation by acquiring the height reservation information from the first aid unit 101 according to need.

This dielectric thickness calculation operation can be used not only for calculating the thickness of a boundary dielectric but also for calculating the thickness of one ore more dielectrics in which components can be embedded.

Suppose embedment of components in each dielectric that constitutes a partial board is permitted. In this case, the thickness of each dielectric of the partial board can be calculated according to the dielectric thickness calculation operation, in the following manner.

Figure 29:
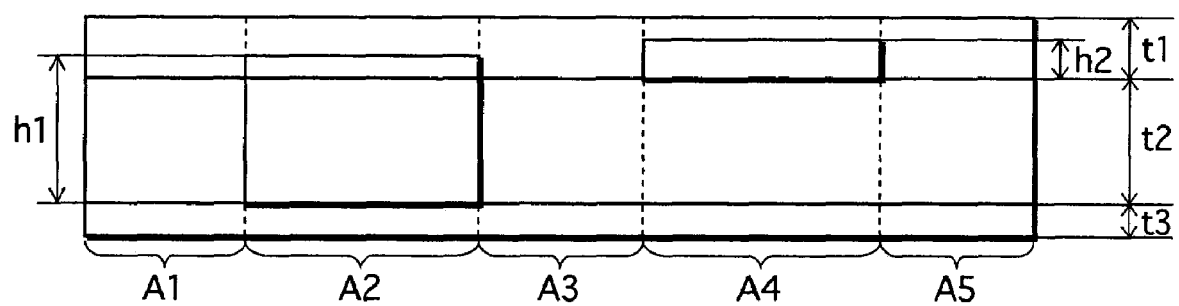
FIG. 29 is a front view showing an example of placement of components.

FIG. 29 is a front view of an advanced-type multilayer wiring board where each dielectric is capable of having embedded components. In the drawing, two components are embedded in three adjacent dielectrics. According to the dielectric thickness calculation operation shown in FIG. 28, a constraint formula for each divided area A1 to A5 of the board surface is set as follows:

| | |
|---|---|
| $s \leq t1, s \leq t2, s \leq t3$ | (areas A1 to A5) |
| $h1 + s \leq t1 + t2$ | (area A2) |
| $h2 + s \leq t1$ | (area A4) |

Solving these constraint formulas yields $$t1 \geq h2+s$$

$$t2 \geq h1-h2$$

$$t3 \geq s$$

Hence minimum values of t1, t2, and t3 satisfying the constraint formulas are $$t1 = h2+s$$

$$t2 = h1-h2$$

$$t3 = s$$

(Wiring Operation)

A wiring operation for partial board B1 is performed independently by the wiring unit 155, and a wiring operation for partial board B2 is performed independently by the wiring unit 255.

The wiring units 155 and 255 are each activated by a wiring command. The wiring unit 155 generates, for each pin of a component mounted on partial board B1, wiring information showing a short wire that is routed from the pin in a predetermined direction depending on whether a connection destination of the pin belongs to partial board B1. Likewise, the wiring unit 255 generates, for each pin of a component mounted on partial board B2, wiring information showing a short wire that is routed from the pin in a predetermined direction depending on whether a connection destination of the pin belongs to partial board B2.

Due to a recent increase in the number of component pins and the pin density, it becomes difficult to achieve complete connection of all wires especially in the vicinity of component pins if wires from component pins are randomly routed. To overcome this difficulty, a method of drawing a short wire from each component pin and connecting other wires to such short wires may be employed.

The wiring operation is performed to assist in design of placement of wires according to this method, in order to route wires from component pins in such directions that increase the possibility of complete connection of all wires.

Figure 30A:
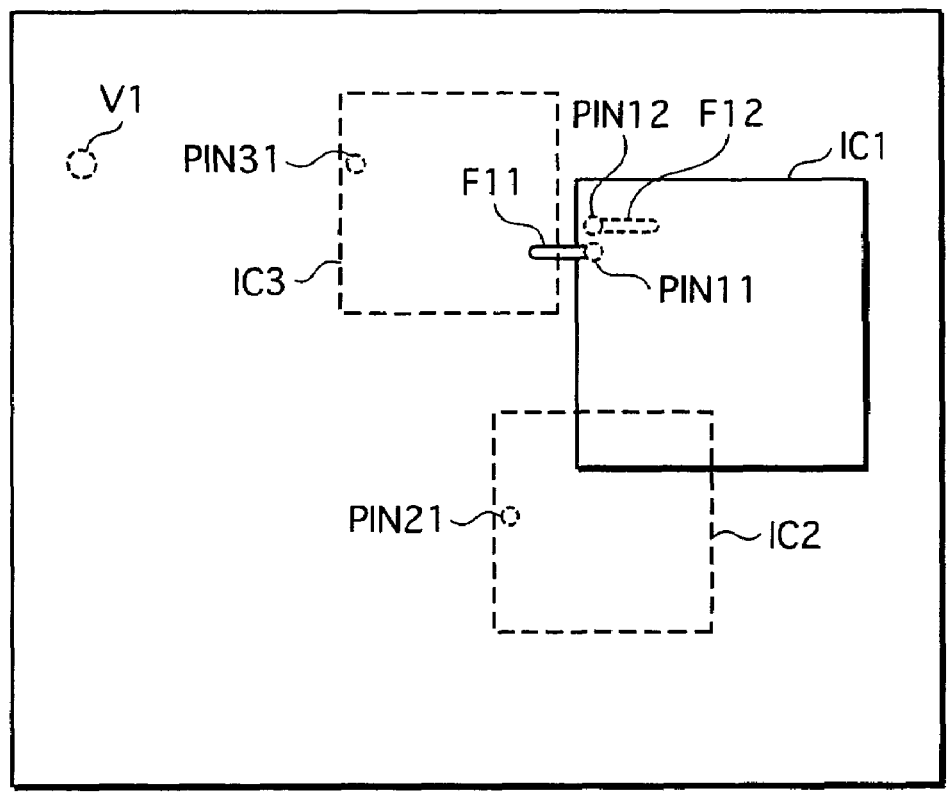
FIGS. 30A and 30B are respectively a top view and a front view showing positions of wires.
Figure 30B:
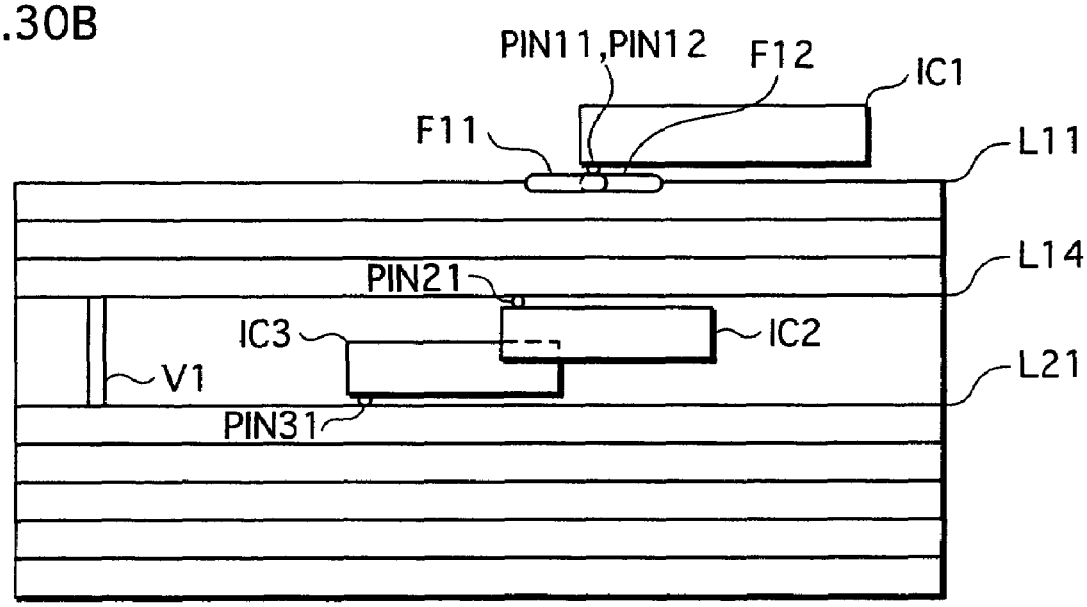

FIGS. 30A and 30B are respectively a top view and a front view showing an example of placement of components and wires from component pins. In the drawing, wires F11 and F12 are routed respectively from pins PIN11 and PIN12 of component IC1, as a result of the wiring operation. Pins PIN11 and PIN12 are to be connected respectively to pin PIN31 of component IC3 and pin PIN21 of component IC2.

It should be noted here that a component to be processed in this wiring operation has an electrical connection pin in the periphery of its outer surface that is in contact with a layer in a multilayer wiring board.

Placement of a pin, placement of a wire, and a connection destination of the pin are shown respectively by pin information, wire information, and net information.

Pin information, wire information, and net information which relate to partial board B1 are stored respectively in a pin table, a wire table, and a net table provided in the partial design information storage unit 141. Pin information, wire information, and net information which relate to partial board B2 are stored respectively in a pin table, a wire table, and a net table provided in the partial design information storage unit 241.

Each of these tables is explained below, taking partial board B1 as an example.

FIG. 31A shows example contents of the pin table. The pin table has a component ID field, a pin ID field, and an XY position field.

The component ID field shows a component ID of a component. The pin ID field shows a pin ID of a pin. The XY position field shows XY coordinates of opposite angles of a placement area of the pin. Meanwhile, a layer on which the pin is positioned is shown by the Z position field of corresponding component placement information in the component placement table (see FIG. 5D).

FIG. 31B shows example contents of the wire table. The wire table has a wire ID field, a net ID field, a Z position field, an XY position field, and a width field.

The wire ID field shows a wire ID of a wire. The net ID field shows a net ID of a net to which the wire belongs. The Z position field shows a layer ID of a layer on which the wire is positioned. The XY position field shows XY coordinates of both ends of the wire. The width field shows a width of the wire.

FIG. 31C shows example contents of the net table. The net table has a net ID field, a net attribute field, a connection pin field, a connection via field, a connection wire field, and a connection attribute field.

The net ID field shows a net ID of a net. The net attribute field shows a type of the net. The connection pin field shows a pin ID of a pin connected to the net. The connection via field shows a via ID of a via connected to the net. The connection wire field shows a wire ID of a wire connected to the net. The connection attribute field shows "GLOBAL" indicating that the net is connected to partial board B2, or "LOCAL" indicating that the net is contained within partial board B1.

The pin table, the wire table, and the net table in the partial design information storage unit 241 hold the pin information, wire information, and net information relating to partial board B2, in the same form as the corresponding tables in the partial design information storage unit 141.

Figure 32:
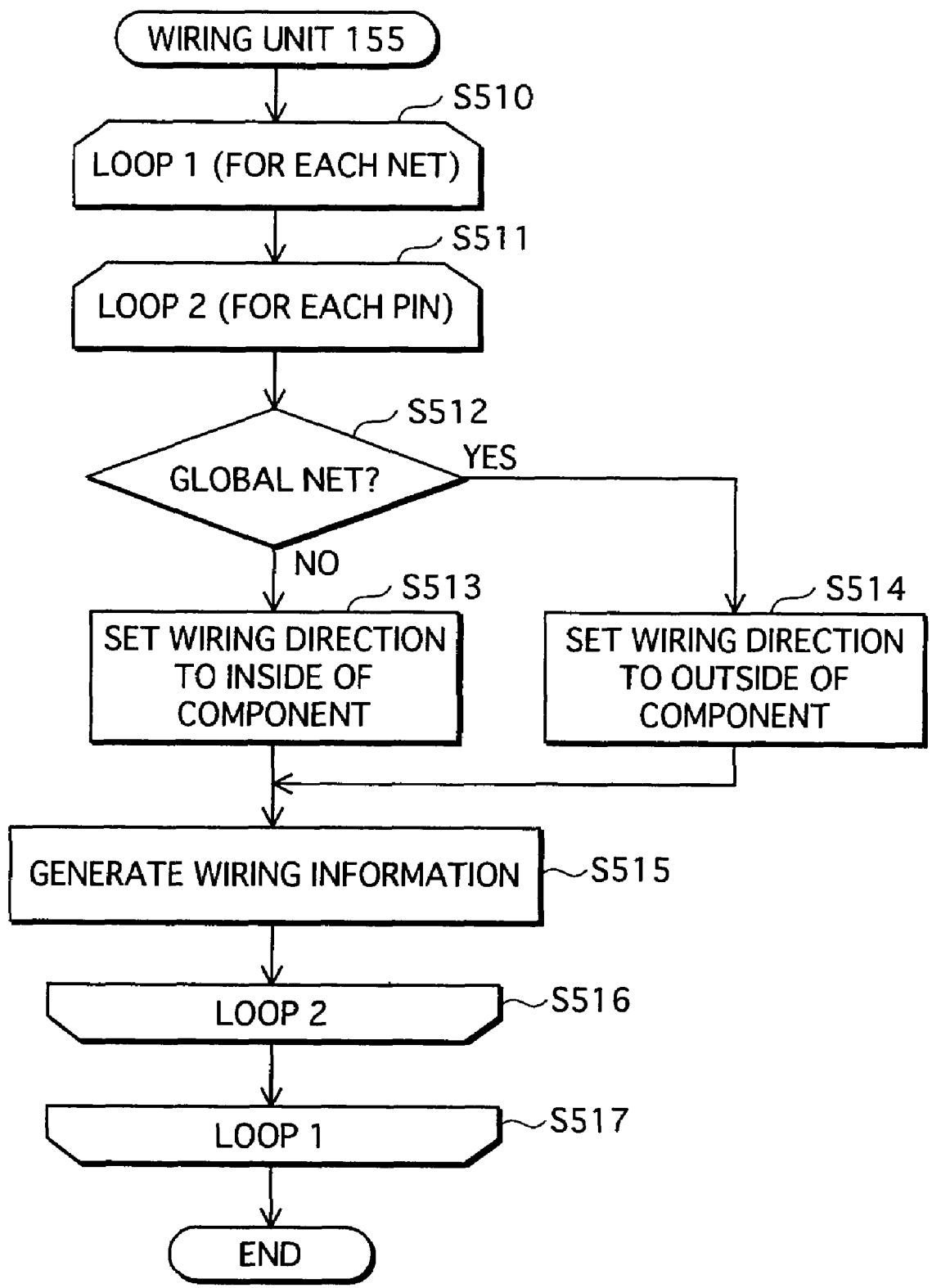
FIG. 32 is a flowchart showing a wiring operation.

FIG. 32 is a flowchart showing a main part of the wiring operation.

This wiring operation is explained step by step below.

(Step S510) The wiring unit 155 selects net information of one net from the net table in the partial design information storage unit 141, and performs steps up to S516.

(Step S511) The wiring unit 155 selects one pin in the connection pin field in the selected net information, and performs steps up to S515.

(Step S512) The wiring unit 155 judges whether the connection attribute field in the net information shows "GLOBAL" or "LOCAL". If the connection attribute field shows "GLOBAL", the wiring unit 155 proceeds to step S514. If the connection attribute field shows "LOCAL", the wiring unit 155 proceeds to step S513.

(Step S513) The wiring unit 155 directs a wire from the selected pin to inside a component on the XY plane. As one example, the wire from the pin is directed away from a nearest side of the component, along with a vertical line which is drawn between the pin and the nearest side on the XY plane.

(Step S514) The wiring unit 155 directs the wire from the selected pin to outside the component on the XY plane. As one example, the wire from the pin is directed to the nearest side of the component, along with the vertical line which is drawn between the pin and the nearest side on the XY plane.

(Step S515) The wiring unit 155 generates wire information showing a placement area of the wire, and adds it to the wire table in the partial design information storage unit 141. This placement area of the wire has a predetermined width and both ends that are a center of the pin and a point apart from the center in the set direction by a predetermined length.

(Step S516) The wiring unit 155 selects another pin from the connection pin field of the net information, and repeats steps S512 to S515.

(Step S517) The wiring unit 155 selects net information of another net from the net table, and repeats steps S511 to S516.

As a result of this wiring operation, wire information such as the one shown in FIG. 31B is generated.

Figure 33A:
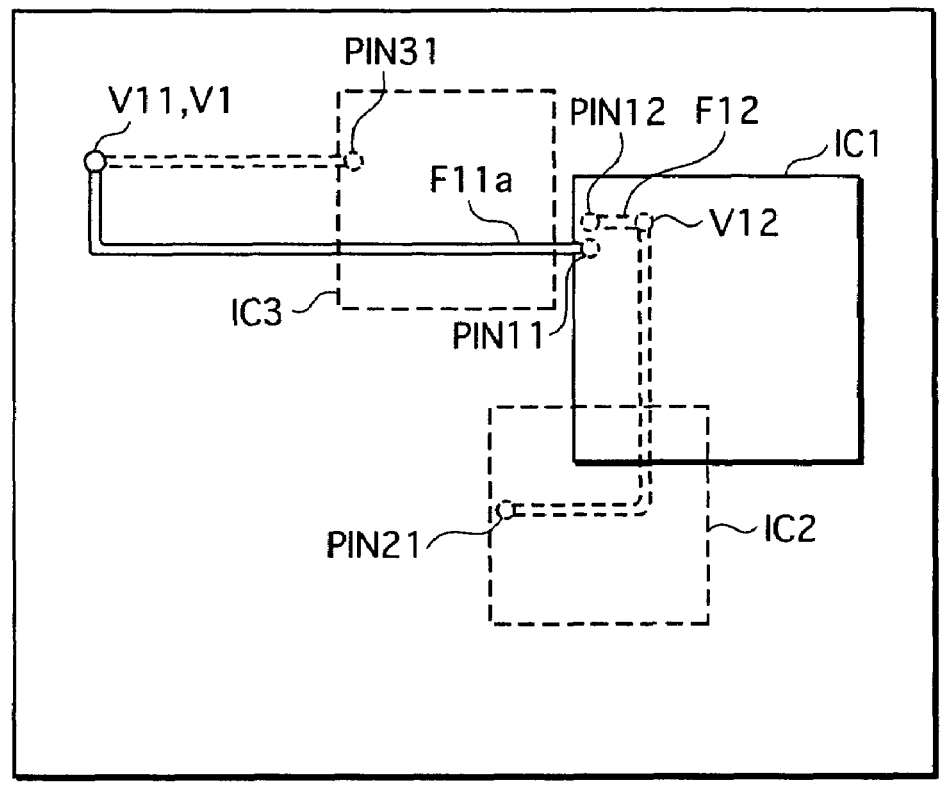
FIGS. 33A and 33B are respectively a top view and a front view showing a result of predetermined connection with the wires shown in FIGS. 30A and 30B.
Figure 33B:
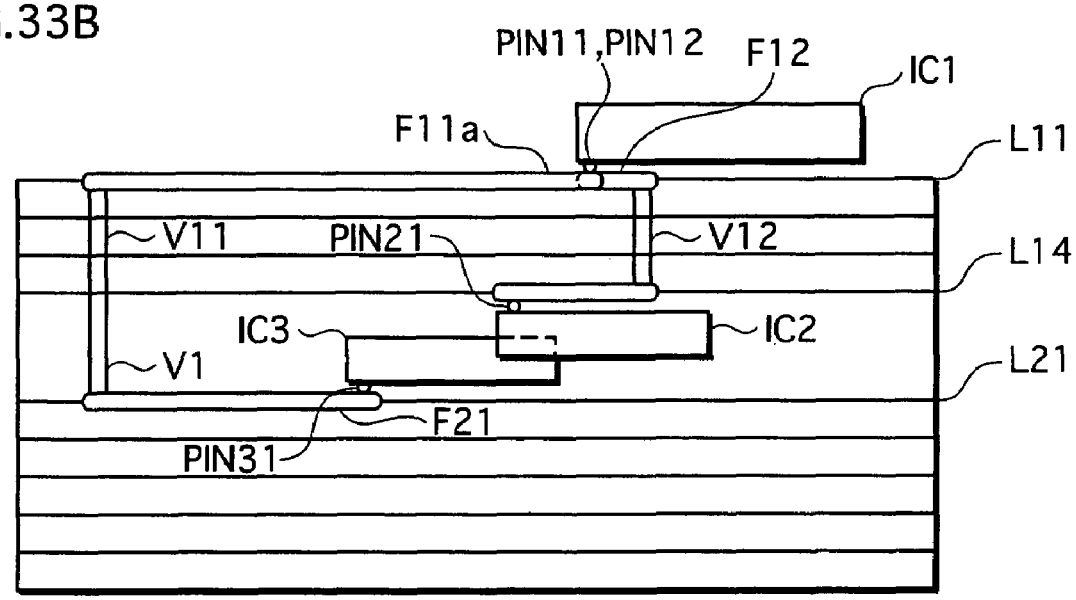

FIGS. 33A and 33B are respectively a top view and a front view showing a situation where the wires shown by the generated wire information are connected with other wires and vias.

A net connected to another partial board (called a global net) needs to pass through a boundary via. The boundary via tends to be placed in the periphery of the board, to avoid components embedded in the boundary dielectric. On the other hand, a net connected within one partial board (called a local net) passes through a via that can be flexibly placed within the partial board. Due to this difference, the routing flexibility of a global net is generally lower than that of a local net. In other words, it is more difficult to rout a global net than a local net.

In view of this, the above wiring operation directs a wire belonging to a local net toward inside a component, and a wire belonging to a global net toward a wide area outside a component. In so doing, the flexibility in routing the global net increases. This effectively prevents a failure to route the global net and thereby a failure to achieve complete connection of all wires.

(Design Aid Apparatus Realized by a Single Computer System)

The design aid apparatus 1 described above is realized by two computer systems that are connected so as to communicate with each other, but the design aid apparatus can equally be realized by a single computer system.

Figure 34:
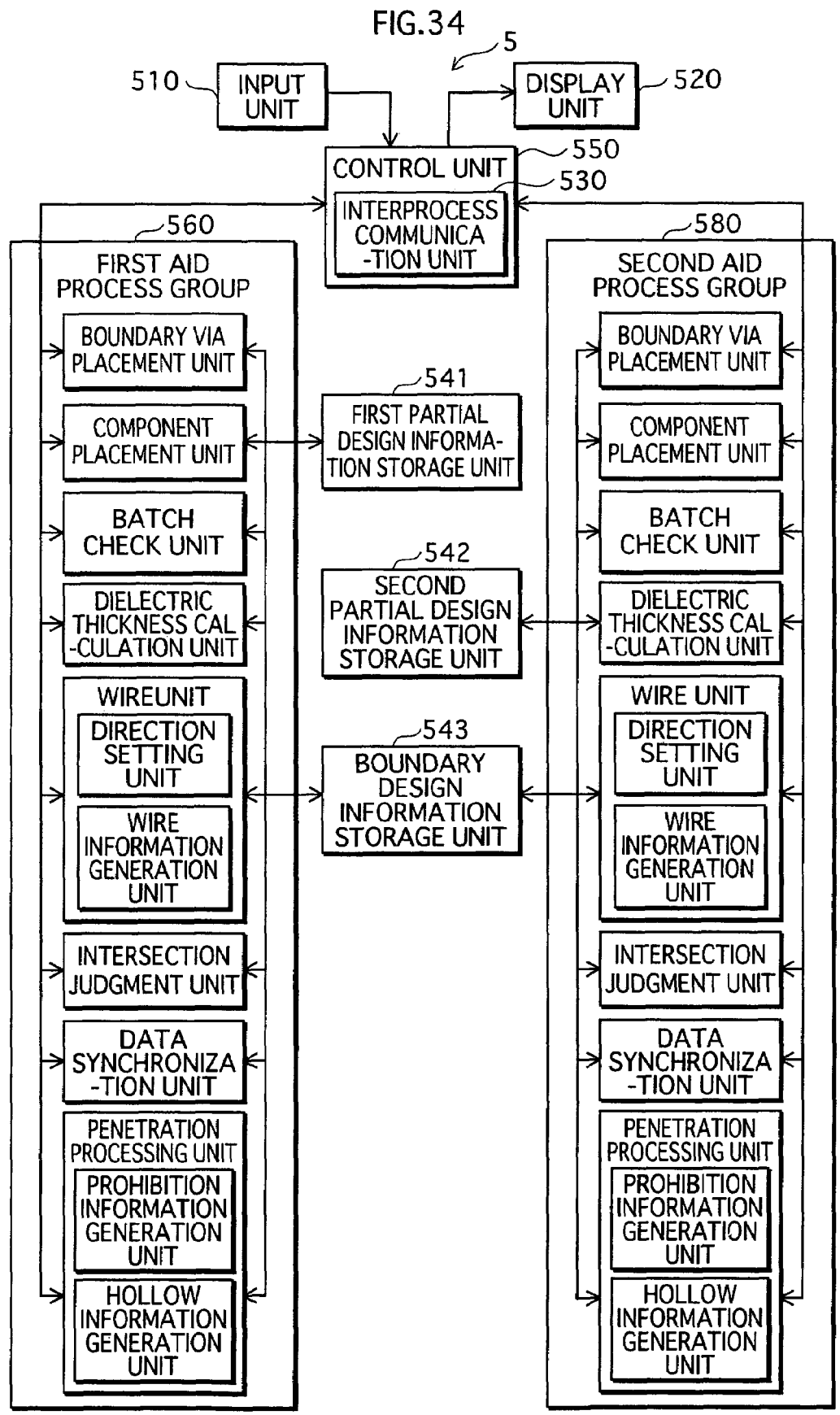
FIG. 34 is a functional block diagram showing another construction of the design aid apparatus.

FIG. 34 is a functional block diagram showing an overall construction of such a design aid apparatus 5.

An input unit 510 can be realized by an input device such as a keyboard and a mouse. A display unit 520 can be realized by a graphics display device capable of multi-window display.

Each construction element included in a first aid process group 560 and a second aid process group 580 is a software process that achieves the same function as the afore-described construction element of the same name, and is executed on a single computer system.

A control unit 550 can be realized by an operating system with a multiprocess management function. The control unit 550 includes an interprocess communication unit 530 for transferring information between the first aid process group 560 and the second aid process group 580.

A first partial design information storage unit 541, a second partial design information storage unit 542, and a boundary design information storage unit 543 store the same information as the partial design information storage unit 141, the partial design information storage unit 241, and the boundary design information storage unit 142, respectively.

Figure 35:
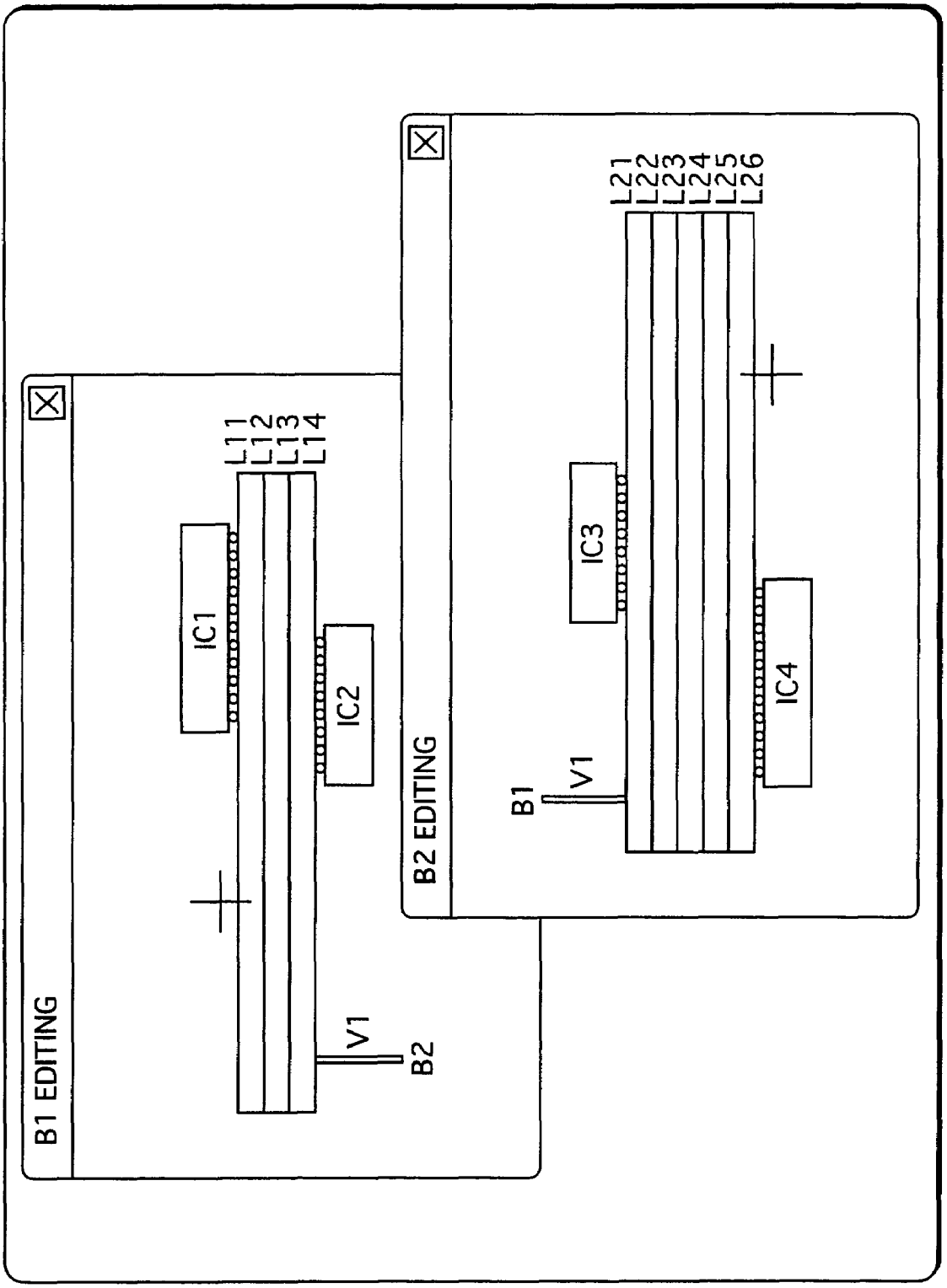
FIG. 35 shows an example screen displayed by the design aid apparatus shown in FIG. 34.

FIG. 35 shows an example screen displayed by the display unit 520. The display unit 520 displays information managed by the first aid process group 560 and information managed by the second aid process group 580, on separate windows.

Design aid operations performed by this design aid apparatus 5 are the same as those explained above.

The design aid apparatus 5 is suitable, for example, when one user designs two partial boards. While designing one partial board, information specific to the other partial board is hidden so that the user can concentrate on the design. Meanwhile, information about the boundary between the partial boards is displayed regardless of which partial board the user is designing. This enables the user to easily maintain the design consistency between the partial boards.

Second Embodiment

The following describes a design information conversion apparatus to which a second embodiment of the present invention relates, with reference to drawings. The design information conversion apparatus converts partial design information and boundary design information described in the first embodiment to total design information about an entire multilayer wiring board, and converts the total design information back to the partial design information and the boundary design information.

One multilayer wiring board is designed in the state of being separated into a plurality of partial boards, under the aid of the design aid apparatus of the first embodiment. After this, the multilayer wiring board is manufactured as a single board. Accordingly, partial design information and boundary design information are suitably used in the design process, whereas total design information is suitably used the manufacturing process. The design information conversion apparatus provides a conversion function between these design information.

Figure 36:
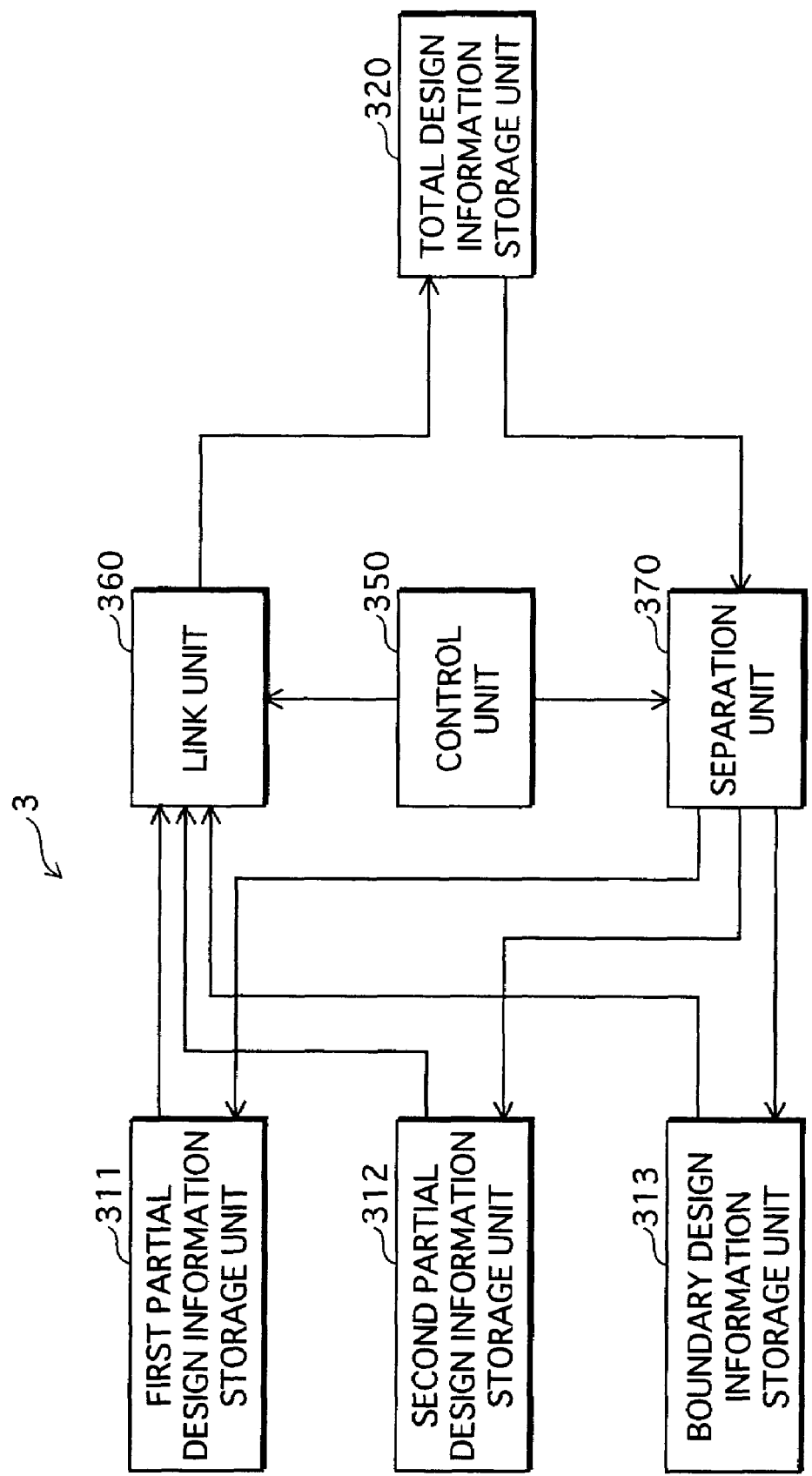
FIG. 36 is a functional block diagram showing an overall construction of a design information conversion apparatus to which a second embodiment of the present invention relates.

FIG. 36 is a functional block diagram showing an overall construction of a design information conversion apparatus 3 according to the second embodiment.

A first partial design information storage unit 311 stores first partial design information relating to partial board B1. A second partial design information storage unit 312 stores second partial design information relating to partial board B2. A boundary design information storage unit 313 stores boundary design information relating to both partial boards B1 and B2. These information is the same as those stored in the partial design information storage unit 141, the partial design information storage unit 241, and the boundary design information storage unit 142 in the first embodiment, respectively.

A total design information storage unit 320 stores total design information relating to entire multilayer wiring board B0. The total design information is a combination of the first partial design information, the second partial design information, and the boundary design information.

A control unit 350, a link unit 360, and a separation unit 370 can be realized by a CPU, a ROM, a RAM, and the like. Functions of each of these construction elements can be achieved by the CPU executing a program stored on the ROM.

The link unit 360 combines the partial design information and the boundary design information into the total design information. The separation unit 370 separates the partial design information and the boundary design information from the total design information. The control unit 350 controls the entire design information conversion apparatus 3.

(Data Structure)

The total design information includes total board information, total layer information, total dielectric information, total component placement information, and total via information that relate to entire multilayer wiring board B0.

These information is stored respectively in a total board table, a total layer table, a total dielectric table, a total component placement table, and a total via table provided in the total design information storage unit 320.

FIG. 37A shows example contents of the total board table. The total board table has a board ID field, a shape filed, and a layer count field. Each of these fields has the same definition as the corresponding field of the same name in the board table (see FIG. 5A).

FIG. 37B shows example contents of the total layer table. The total layer table has a layer ID field and a layer type field. Each of these fields has the same definition as the corresponding field of the same name in the layer table (see FIG. 5B).

FIG. 37C shows example contents of the total dielectric table. The total dielectric table has a dielectric ID field, a Z position field, a dielectric constant field, a thickness field, and a division field.

The division field shows whether multilayer wiring board B0 can be separated into partial boards with the dielectric as a boundary dielectric. The other fields each have the same definition as the corresponding field of the same name in the dielectric table (see FIG. 5C).

FIG. 37D shows example contents of the total component placement table. The total component placement table has a component ID field, a component type field, a Z position field, a placement direction field, an XY position field, and a height field.

The placement direction field shows the symbol "A" indicating that a component is placed on an upper side of a layer shown by the Z position field (i.e. on the side of the layer with a larger Z coordinate), or the symbol "B" indicating that the component is placed on a lower side of the layer shown by the Z position field (i.e. on the side of the layer with a smaller z coordinate). The other fields each have the same definition as the corresponding field of the same name in the component placement table (see FIG. 5D).

FIG. 37E shows example contents of the total via table. The total via table has a via ID field, a net ID field, a Z position field, an XY position field, and a diameter field. Each of these fields has the same definition as the corresponding field of the same name in the boundary via table (see FIG. 6B).

(Link Operation)

Figure 38:
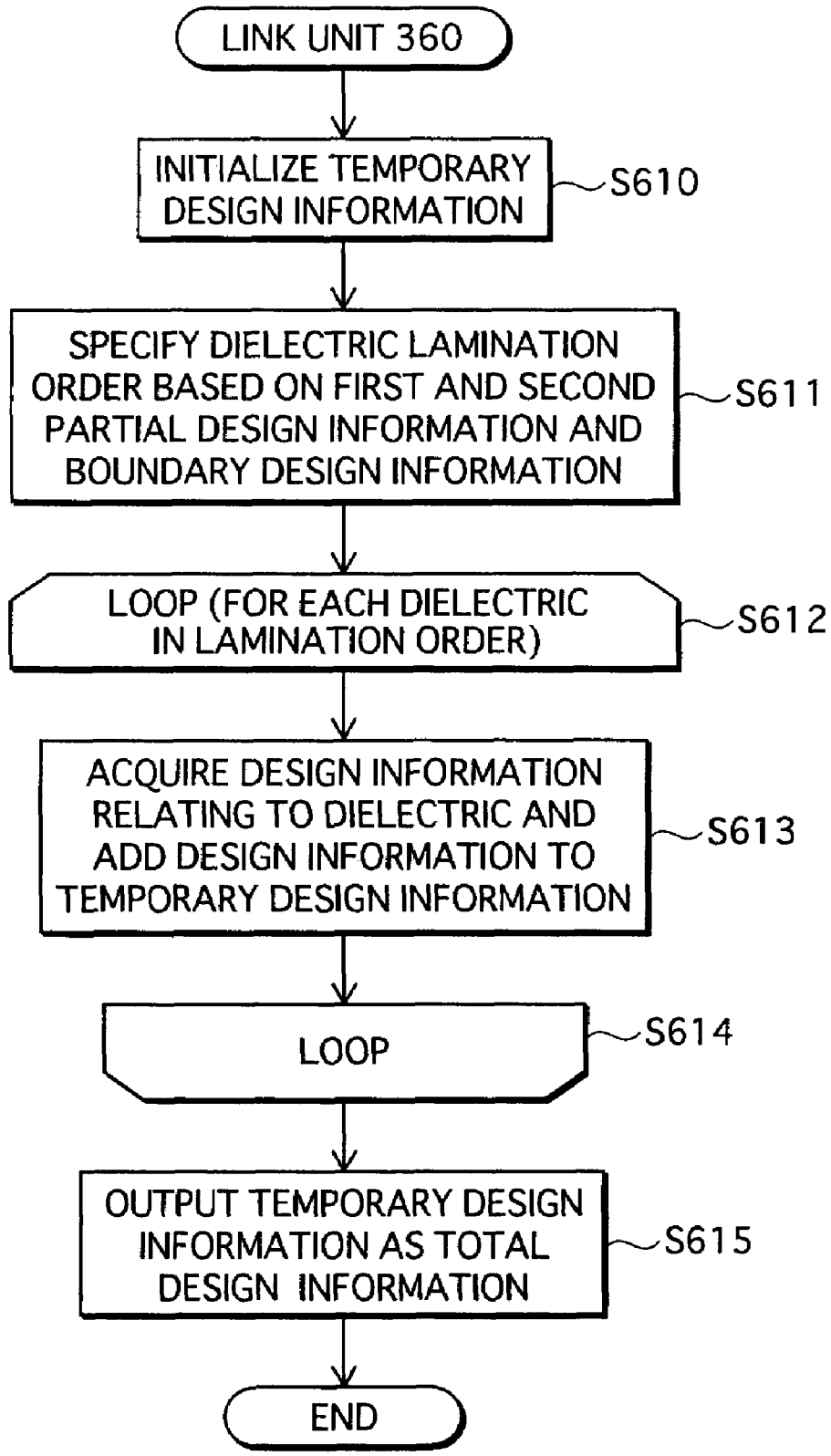
FIG. 38 is a flowchart showing a link operation.

FIG. 38 is a flowchart showing a main part of a link operation performed by the link unit 360. The link operation is carried out using temporary design information as working information. The link unit 360 holds a temporary layer table, a temporary dielectric table, a temporary component placement table, and a temporary via table (not illustrated), that respectively have the same form as the total layer table, the total dielectric table, the total component placement table, and the total via table in the total design information storage unit 320. The link unit 360 stores temporary design information in these tables.

The link operation is explained step by step below.

(Step S610) The link unit 360 erases temporary design information stored in the temporary layer table, the temporary dielectric table, the temporary component placement table, and the temporary via table, to initialize these tables.

(Step S611) The link unit 360 specifies a lamination order of dielectrics (including a boundary dielectric), with reference to first partial design information, second partial design information, and boundary design information.

In detail, the link unit 360 specifies that boundary dielectric SD1 is positioned between layer L14 of partial board B1 and layer L21 of partial board B2, with reference to the Z position field in the boundary dielectric table (see FIG. 6A) in the boundary design information storage unit 313. The link unit 360 then specifies that dielectrics D11 to D13, SD1, and D21 to D25 are laminated in this order, based on the consecutiveness of layer IDs with reference to the Z position fields in the dielectric tables (see FIGS. 5C and 7C) in the first partial design information storage unit 311 and the second partial design information storage unit 312.

(Step S612) The link unit 360 selects one dielectric at a time in the lamination order, and performs step S613.

(Step S613) The link unit 360 acquires first partial design information, second partial design information, and boundary design information that relate to the selected dielectric, and sets the acquired information as temporary design information.

In more detail, the link unit 360 acquires dielectric information or boundary dielectric information relating to the selected dielectric, from the dielectric tables in the first partial design information storage unit 311 and the second partial design information storage unit 312 or from the boundary dielectric table (see FIG. 6A) in the boundary design information storage unit 313. The link unit 360 adds the acquired dielectric information to the temporary dielectric table.

If the selected dielectric is a boundary dielectric, the link unit 360 sets the division field of the temporary dielectric table to be "POSSIBLE". If the selected dielectric is not a boundary dielectric, the link unit 360 sets the division field to be "NOT POSSIBLE".

The link unit 360 also acquires layer information relating to each layer shown by the Z position field in the acquired dielectric information, from the layer tables (see FIGS. 5B and 7B) in the first partial design information storage unit 311 and the second partial design information storage unit 312. The link unit 360 adds the acquired layer information to the temporary layer table so as not to overlap with existing information.

The link unit 360 further acquires component placement information having any of the layer IDs shown by the Z position field of the acquired dielectric information, from the component placement tables (see FIGS. 5D and 7D) in the first partial design information storage unit 311 and the second partial design information storage unit 312. The link unit 360 adds the acquired component placement information to the temporary component placement table so as not to overlap with existing information.

If the Z position field in the acquired component placement information shows "TOP", the link unit 360 sets the placement direction field in the temporary component placement table to be "A". If the Z position field shows "BOTTOM", the link unit 360 sets the placement direction field to be "B".

The link unit 360 also acquires via information whose Z position field matches the dielectric ID field of the acquired dielectric information, from the boundary via table (see FIG. 6B) in the boundary design information storage unit 313. The link unit 360 adds the acquired via information to the temporary via table.

(Step S614) The link unit 360 selects the next dielectric in the lamination order, and repeats step S613.

(Step S615) The link unit 360 generates board information. In detail, the link unit 360 sets a predetermined name for identifying entire multilayer wiring board B0, in the board ID field of the board information. The link unit 360 also sets the contents of the shape field in the board table (see FIG. 5A) in the first partial design information storage unit 311, in the shape field of the board information. The link unit 360 further sets the number of layers shown in the temporary layer table, in the layer count field of the board information. The link unit 360 outputs the generated board information to the total board table in the total design information storage unit 320.

The link unit 360 also outputs the contents of the temporary layer table, the temporary dielectric table, the temporary component placement table, and the temporary via table, respectively to the total layer table, the total dielectric table, the total component placement table, and the total via table in the total design information storage unit 320.

(Separation Operation)

Figure 39:
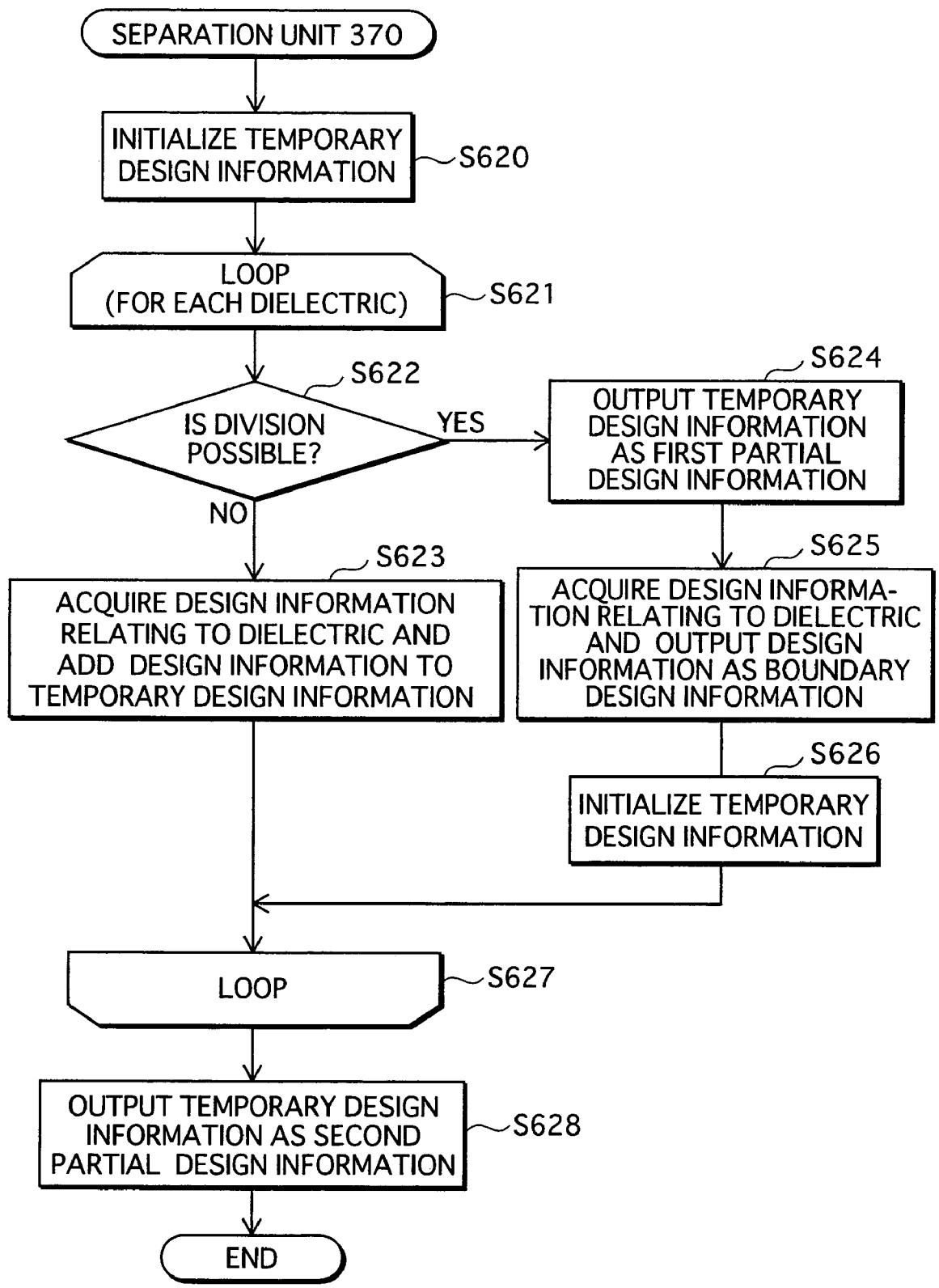
FIG. 39 is a flowchart showing a separation operation.
Figure 40:
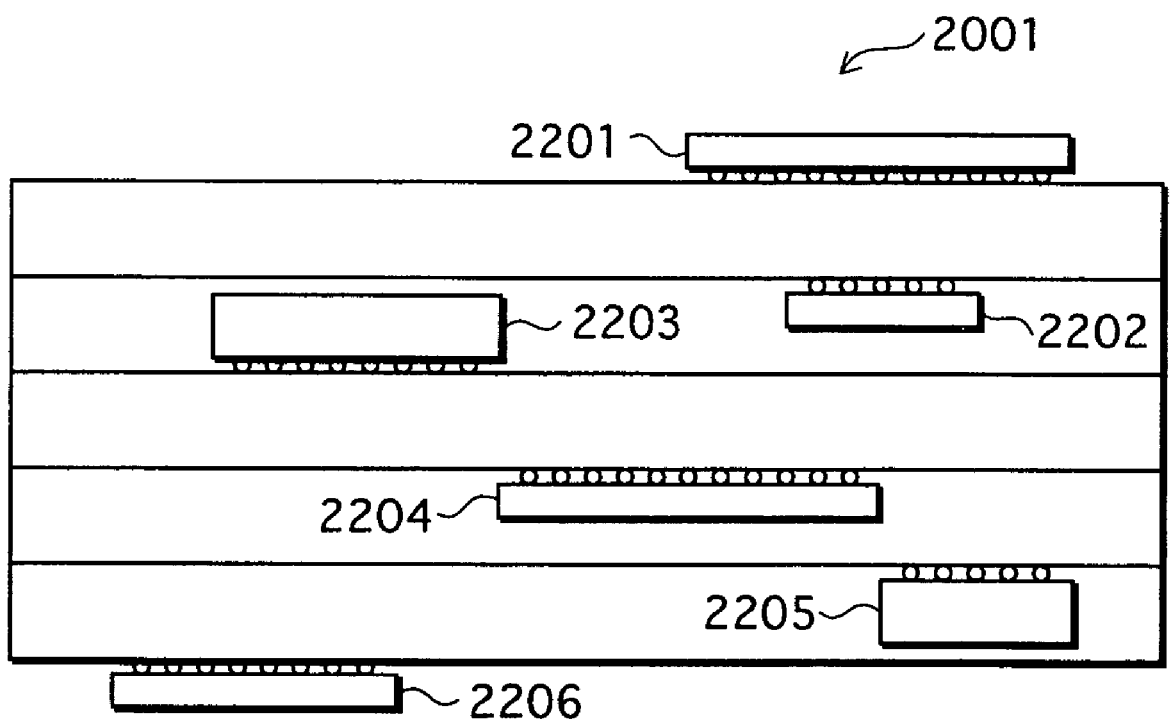
FIG. 40 shows an example multilayer wiring board with embedded components.
Figure 41:
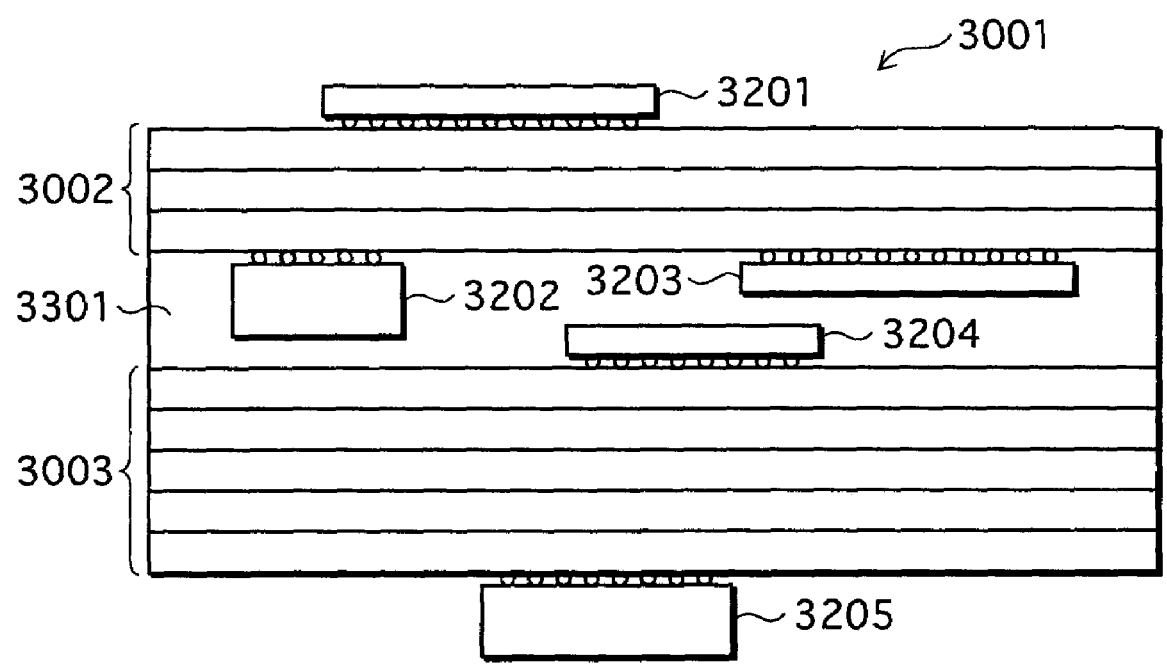
FIG. 41 shows an example multilayer wiring board having a plurality of board portions.

FIG. 39 is a flowchart showing a main part of a separation operation performed by the separation unit 370. The separation operation is carried out using temporary design information as working information. The separation unit 370 holds a temporary layer table, a temporary dielectric table, and a temporary component placemen table (not illustrated), that respectively have the same form as the layer table, the dielectric table, and the component placement table in the first partial design information storage unit 311. The separation unit 370 stores temporary design information in these tables.

The separation operation is explained step by step below.

(Step S620) The separation unit 370 erases temporary design information from the temporary layer table, the temporary dielectric table, and the temporary component placement table, to initialize these tables.

(Step S621) The separation unit 370 selects one dielectric at a time from the total dielectric table in the storage order, and performs steps up to S626.

(Step S622) If the division field of dielectric information corresponding to the selected dielectric in the total dielectric table shows "NOT POSSIBLE", the separation unit 370 proceeds to step S623. Otherwise, the separation unit 370 proceeds to step S624.

(Step S623) The separation unit 370 acquires total design information relating to the selected dielectric, and sets the acquired total design information as temporary design information.

In more detail, the separation unit 370 acquires the dielectric information corresponding to the selected dielectric, from the total dielectric table in the total design information storage unit 320. The separation unit 370 adds the acquired dielectric information to the temporary dielectric table.

The separation unit 370 also acquires layer information having any of the layer IDs shown by the Z position field of the acquired dielectric information, from the total layer table in the total design information storage unit 320. The separation unit 370 adds the acquired layer information to the temporary layer table so as not to overlap with existing information.

The separation unit 370 further acquires component placement information having any of the layer IDs shown by the Z position field of the acquired dielectric information, from the total component placement table in the total design information storage unit 320. The separation unit 370 adds the acquired component placement information to the temporary component placement table so as not to overlap with existing information.

(Step S624) The separation unit 370 generates board information. In detail, the separation unit 370 sets a predetermined name for identifying partial board B1, in the board ID field of the board information. The separation unit 370 also sets the contents of the shape field in the total board table in the total design information storage unit 320, in the shape field of the board information. The separation unit 370 further sets the number of layers shown in the temporary layer table, in the layer count field of the board information. The separation unit 370 outputs the generated board information to the board table in the first partial design information storage unit 311.

The separation unit 370 also outputs the contents of the temporary layer table, the temporary dielectric table, and the temporary component placement table, respectively to the layer table, the dielectric table, and the component placement table in the first partial design information storage unit 311.

(Step S625) The separation unit 370 acquires the total design information relating to the selected dielectric, and outputs the acquired total design information as boundary design information.

In detail, the separation unit 370 acquires the dielectric information corresponding to the selected dielectric from the total dielectric table in the total design information storage unit 320, and outputs it to the boundary dielectric table in the boundary design information storage unit 313.

The separation unit 370 then acquires via information whose Z position field matches the dielectric ID field of the acquired dielectric information, from the total via table in the total design information storage unit 320. The separation unit 370 outputs the acquired via information to the boundary via table in the boundary design information storage unit 313.

(Step S626) The separation unit 370 initializes the temporary layer table, the temporary dielectric table, and the temporary component placement table.

(Step S627) The separation unit 370 selects the next dielectric, and repeats steps S622 to S626.

(Step S628) The separation unit 370 generates board information. In detail, the separation unit 370 sets a predetermined name for identifying partial board B2, in the board ID field of the board information. The separation unit 370 also sets the contents of the shape field in the total board table in the total design information storage unit 320, in the shape field of the board information. The separation unit 370 further sets the number of layers shown in the temporary layer table, in the layer count field of the board information. The separation unit 370 outputs the generated board information to the board table in the second partial design information storage unit 312.

The separation unit 370 also outputs the contents of the temporary layer table, the temporary dielectric table, and the temporary component placement table, respectively to the layer table, the dielectric table, and the component placement table in the second partial design information storage unit 312.

Modifications

The present invention has been described by way of the above embodiments, though it should be obvious that the present invention is not limited to the above. Example modifications are given below.

The present invention also applies to a computer program which is executed by a computer system to realize a method including steps described in the above embodiments. Such a computer program may be distributed as a digital signal.

The present invention may be realized by a computer-readable storage medium, such as a flexible disk, a hard disk, a CD, an MO, a DVD, a BD, or a semiconductor memory, on which the computer program or digital signal mentioned above is recorded.

The computer program or digital signal that achieves the present invention may also be transmitted via a network, such as an electronic communication network, a wired or wireless communication network, or the Internet.

The computer program or digital signal that achieves the present invention may be provided to an independent computer system by distributing a storage medium on which the computer program or digital signal is recorded, or by transmitting the computer program or digital signal via a network. The independent computer system may then execute the computer program or digital signal to function as the present invention.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A design aid apparatus for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, placement of a first object to the first portion being designed by one of two computers that are in a communicative state, placement of a second object to the second portion being designed by another one of the two computers, and placement of a boundary object to the specific dielectric being designed by each of the computers, comprising:

a first aid unit realized by the computer, and including:
    a first display unit operable to display boundary design information about the placement of the boundary object and first design information about the placement of the first object, without displaying second design information about the placement of the second object;
    a first input unit operable to receive a design input instruction for the boundary design information and the first design information displayed by the first display unit, from a user;
    a first update unit operable to update the boundary design information and the first design information, according to the design input instruction received by the first input unit; and
a second aid unit
realized by the other computer, and including:
    a second display unit operable to display the boundary design information and the second design information, without displaying the first design information;
    a second input unit operable to receive a design input instruction for the boundary design information and the second design information displayed by the second display unit, from the user; and
    a second update unit operable to update the boundary design information and the second design information according to the design input instruction received by the second input unit.

2. The design aid apparatus of claim 1,
wherein the first object is a component that has an electrical connection point at the first portion and is embedded in the specific dielectric,
the second object is a component that has an electrical connection point at the second portion and is embedded in the specific dielectric, and
the boundary object is a via that has electrical connection points at both the first portion and the second portion, and is formed in die specific dielectric.

3. A design aid apparatus for aiding in design of placement of objects for a multilayer wiring board that is formed by laminating a plurality of dielectrics including a specific dielectric capable of having components embedded therein, the design being performed by a single computer separately on a first portion made up of a set of dielectrics adjacent to one side of the specific dielectric and a second portion made up of a set of dielectrics adjacent to an opposite side of the specific dielectric, by designing placement of a first object to the first portion, designing placement of a second object to the second portion, and designing placement of a boundary object to the specific dielectric, comprising;
a display unit operable to display boundary design information about the placement of the first object on one window and display the boundary design information and second design information about the placement of the second object on another window, using a GUI;
a first aid unit operable to update the boundary design information and the first design information according to a design input instruction from a user; and
a second aid unit operable to update the boundary design information and the second design information according to a design input instruction from the user.

4. The design aid apparatus of claim 1,
wherein the second portion is incapable of having components embedded therein or is prohibited to have components embedded therein, and
the second input unit accepts a user instruction to place a component to the second portion, only if the component is to be placed on an end of the second portion in a lamination direction so as to be located outside the second portion.

5. The design aid apparatus of claim 1,
wherein each of the first aid unit and the second aid unit holds to boundary design information, and each of the first update unit and the second update unit includes;
a send unit operable to send, if the held boundary design information is updated, notification information indicating the update to the other update unit; and
a data synchronization unit operable to modify the held boundary design information to be identical to the boundary design information updated in the other update unit, based on notification information sent from the other update unit.

6. The design aid apparatus of claim 1,
wherein the second update unit judges, in cooperation with the first update unit, whether the first object is an obstacle to at least one of the placement of to second object and the placement of the boundary object.

7. The design aid apparatus of claim 6,
wherein to second update unit includes:
a send unit operable to send at least one of inquiry information corresponding to the placement of the second object and inquiry information corresponding to the placement of the boundary object, to the first aid unit,
the first update unit includes:
an intersection judgment unit operable to judge, based on the inquiry information sent from the second aid unit, whether a placement area of the first object intersects with at least one of a placement area of the second object and a placement area of the boundary object; and
a reply unit operable to send a result of the judgment by the intersection judgment unit, to the second aid unit, and
the second update unit judges that the first object is the obstacle, if the result of the judgment sent from the first aid unit is affirmative.

8. The design aid apparatus of claim 6,
wherein the first update unit includes:
a send unit operable to send notification information corresponding to the placement of the first object to the second aid unit,
the second update unit includes:
a storage unit operable to store the notification information, and
the second update unit judges, based on the notification information stored in the storage unit, whether a placement area of the first object intersects with at least one of a placement area of the second object and a placement area of the boundary object, and if a result of the judgment is affirmative, judges that the first object is the obstacle.

9. The design aid apparatus of claim 6,
wherein if the first object is judged as the obstacle, the second update unit generates at least one of design information about alternative placement of the second object and boundary design information about alternative placement of the boundary object so that the first object is no longer the obstacle.

10. The design aid apparatus of claim 6,
wherein the second update unit includes:
a send unit operable to send, if the first object is judged as the obstacle, at least one of notification information corresponding to the placement of the second object and notification information corresponding to the placement of the boundary object, to the first aid unit, and
the first update unit generates, based on the notification information sent from the second aid unit, design information about alternative placement of the first object so that the first object is no longer the obstacle.

11. The design aid apparatus of claim 1,
wherein the second update unit includes:
a send unit operable to send notification information corresponding to the placement of the second object to the first aid unit, and
the first update unit includes:
a prohibition information generation unit operable to generate, based on the notification information, prohibition information showing a prohibition area where placement of objects is prohibited, the prohibition area including an area of the first portion that intersects with a placement area of the second object.

12. The design aid apparatus of claim 1,
wherein the second update unit includes:
a send unit operable to send notification information corresponding to the placement of the second object to the first aid unit, and
the first update unit includes:
a hollow information generation unit operable to generate, based on the notification information, hollow information showing a hollow area which is devoid of a dielectric substance, the hollow area including an area of the first portion that intersects with a placement area of the second object.

13. The design aid apparatus of claim 1, wherein each of the first update unit and the second update unit includes:

a dielectric thickness calculation unit operable to calculate a thickness of at least one of the plurality of dielectrics, in accordance with placement of a component embedded in the dielectric.

14. The design aid apparatus of claim 1, wherein each of the first update unit and the second update unit includes:
- a direction setting unit operable to set a direction of a wire from an electrical connection pin that is provided on a periphery of an outer surface of a component which is placed to the first portion or the second portion, depending on whether the electrical connection pin is connected to an object placed to the same portion as the component; and
- a wire information generation unit operable to generate wire information showing an area that has a predetermined width and extends from the electrical connection pin in the set direction by a predetermined length, as a placement area of the wire.

15. A design aid method for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, the aiding being performed using a first aid unit operable to design placement of a second object to the second portion and the placement of the boundary object to the specific dielectric, the first aid unit and the second aid unit being realized by separate computers, the design aid method comprising:
- a first aid step performed by the first aid unit and including:
  - a first display step of displaying boundary design information about the placement of the boundary object and first design information about the placement of the first object, without displaying second design information about the placement of the second object; and
  - a first update step of updating the first design information according to a design input instruction from a user; and
- a second aid step performed by the second aid unit and including:
  - a second display step of displaying the boundary design information and the second design information, without displaying the first design information; and
  - a second update step of updating the second design information according to a design input instruction from the user that is given independently of the first aid step,
- wherein each of the first aid step and the second aid step cooperatively synchronizes the boundary design information with the boundary design information updated by the other aid step.

16. A storage medium storing a program for aiding in design of placement of objects for a multilayer wiring board that is formed by laminating a plurality of dielectrics including a specific dielectric capable of having components embedded therein, the design being performed separately on a first portion made up of a set of dielectrics adjacent to one side of the specific dielectric and a second portion made up of a set of dielectrics adjacent to an opposite side of the specific dielectric, the aiding being performed using a first aid unit operable to design placement of a first object to the first portion and placement of a boundary object to the specific dielectric and a second aid unit operable to design placement of a second object to the second portion and the placement of the boundary object to the specific dielectric, the program comprising code for causing a computer that realizes the first aid unit and a computer that realizes the second aid unit to perform:
- a first aid step performed by the first aid unit and including:
  - a first display step of displaying boundary design information about the placement of the boundary object and first design information about the placement of the first object, without displaying second design information about the placement of the second object; and
  - a first update step of updating the first design information according to a design input instruction from a user;
- a second aid step performed by the second aid unit and including:
  - a second display step of displaying the boundary design information and the second design information, without displaying the first design information; and
  - a second update step of updating the second design information according to a design input instruction from the user that is given independently of the first aid step; and
- a boundary cooperation step of each of the first aid unit and the second aid unit cooperatively synchronizing the boundary design information with the boundary design information updated in the other aid step.

17. A method of placing components on a multilayer wiring board formed by laminating a plurality of dielectrics including one of the plurality of dielectrics having components embedded therein comprising:
- dividing a set of dielectrics into a first portion of a first predetermined area on a first side of the set of dielectrics and a second portion of a second predetermined area on a second side of the set of dielectrics;
- displaying on a first design aid operative to design the first side of the dielectric, design information relevant only to the first side of the set of dielectrics:
- entering a placement position on the first design aid for a first object on the first portion;
- displaying design information relative to the first object placement position;
- entering on a second design aid operative to design the second side of the dielectric concurrently with the first aid operative to design the first side of the dielectric a placement position for a second object on the second portion;
- displaying on a second design aid operative to design the second side of the dielectric, design information relevant only to the second side of the set of dielectrics;
- displaying on the second design aid design information relative to the second object placement position;
- determining via design information for a via placement that extends to both the first portion and the second portion; and
- adjusting the relative placement of the first object placement position, the via placement and the second object placement position using the first design aid to design an operative interface that avoids interference between the first object and the second object.

18. The method of claim 17 further comprising displaying the operative interface on the first design aid.

19. The method of claim 18 further comprising displaying the operative interface on the second design aid.

* * * * *

UNITED STATES PATENT AND TRADEMARK OFFICE
CERTIFICATE OF CORRECTION

| | |
|---|---|
| PATENT NO. | : 7,237,219 B2 |
| APPLICATION NO. | : 11/042978 |
| DATED | : June 26, 2007 |
| INVENTOR(S) | : Ikeda et al. |

It is certified that error appears in the above-identified patent and that said Letters Patent is hereby corrected as shown below:

In the Claims:
Column 35, line 45, "to" should be --the--;
Column 35, line 58, "of to second" should be --of the second--;
Column 35, line 61, "to" should be --the--.

Signed and Sealed this

Second Day of October, 2007

JON W. DUDAS
*Director of the United States Patent and Trademark Office*